US012690341B2

(12) United States Patent
An et al.

(10) Patent No.: US 12,690,341 B2
(45) Date of Patent: Jul. 21, 2026

(54) DISPLAY AND ELECTRONIC DEVICE

(71) Applicant: Huawei Technologies Co., Ltd., Shenzhen (CN)

(72) Inventors: Yabin An, Shenzhen (CN); Haiming He, Shenzhen (CN); Yongqiang Pang, Shenzhen (CN); Xuhui Tian, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 1040 days.

(21) Appl. No.: 17/784,541

(22) PCT Filed: Nov. 26, 2020

(86) PCT No.: PCT/CN2020/131920
§ 371 (c)(1),
(2) Date: Jun. 10, 2022

(87) PCT Pub. No.: WO2021/115131
PCT Pub. Date: Jun. 17, 2021

(65) Prior Publication Data

US 2023/0035664 A1 Feb. 2, 2023

(30) Foreign Application Priority Data

Dec. 13, 2019 (CN) .......................... 201911284587.2
Feb. 20, 2020 (CN) .......................... 202010106846.9

(51) Int. Cl.
*H10K 59/124* (2023.01)
*G09G 3/3233* (2016.01)

(52) U.S. Cl.
CPC ......... *H10K 59/124* (2023.02); *G09G 3/3233* (2013.01); *G09G 2300/0426* (2013.01); *G09G 2300/0842* (2013.01)

(58) Field of Classification Search
CPC ... H10K 59/124; H10K 59/1213; H10D 86/60
See application file for complete search history.

(56) References Cited

U.S. PATENT DOCUMENTS 10,290,657 B2 5/2019 Hanyu et al.
10,373,982 B2 8/2019 Sasaki et al.
(Continued)

FOREIGN PATENT DOCUMENTS

CN 103529608 A 1/2014
CN 104332485 A 2/2015
(Continued)

*Primary Examiner* — Errol V Fernandes
(74) *Attorney, Agent, or Firm* — Leydig, Voit & Mayer, Ltd.

(57) ABSTRACT

A display includes a plurality of sub pixels, a substrate, a light-emitting device, a pixel circuit, and an isolation portion. The light-emitting device, the pixel circuit, and the isolation portion are disposed on the substrate. The pixel circuit and the light-emitting device are coupled, and are located in the sub pixel. The pixel circuit includes a first transistor and a second transistor. An active layer of the first transistor includes polycrystalline silicon, and an active layer of the second transistor includes a semiconductor oxide. The isolation portion is configured at least to block hydrogen ions in the active layer of the first transistor from being diffused into the active layer of the second transistor.

20 Claims, 11 Drawing Sheets

(56) References Cited

U.S. PATENT DOCUMENTS

| | | | |
|---|---|---|---|
| 2003/0057422 A1 | 3/2003 | Yamazaki et al. | |
| 2017/0294498 A1 | 10/2017 | Kwon | |
| 2017/0338252 A1 | 11/2017 | Lee et al. | |
| 2018/0175076 A1 | 6/2018 | Kim et al. | |
| 2019/0123069 A1 | 4/2019 | Yang et al. | |
| 2019/0267409 A1* | 8/2019 | Hu | H10D 30/6755 |
| 2021/0375952 A1* | 12/2021 | Tian | H10D 86/431 |

FOREIGN PATENT DOCUMENTS

| | | | |
|---|---|---|---|
| CN | 105453099 A | 3/2016 | |
| CN | 106783628 A | 5/2017 | |
| CN | 107403804 A | 11/2017 | |
| CN | 107452756 A | 12/2017 | |
| CN | 107871472 A | 4/2018 | |
| CN | 108598093 A | 9/2018 | |
| CN | 108766382 A | 11/2018 | |
| CN | 108803181 A | 11/2018 | |
| CN | 108807549 A | 11/2018 | |
| CN | 109300840 A | 2/2019 | |
| CN | 109521596 A | 3/2019 | |
| CN | 109742089 A | 5/2019 | |
| CN | 109817645 A | 5/2019 | |
| CN | 110299322 A | 10/2019 | |
| CN | 110366779 A | 10/2019 | |
| CN | 110534531 A | 12/2019 | |
| JP | 2003086356 A | 3/2003 | |
| JP | 2014010435 A | 1/2014 | |
| JP | 2017167515 A | 9/2017 | |
| KR | 20150061076 A | 6/2015 | |

* cited by examiner

01

10

12

11

100

100

DISPLAY AND ELECTRONIC DEVICE

CROSS-REFERENCE TO RELATED APPLICATIONS

This application is a National Stage of International Application No. PCT/CN2020/131920, filed on Nov. 26, 2020, which claims priority to Chinese Patent Application No. 201911284587.2, filed on Dec. 13, 2019 and Chinese Patent Application No. 202010106846.9, filed on Feb. 20, 2020. All of the aforementioned applications are hereby incorporated by reference in their entireties.

TECHNICAL FIELD

This application relates to the field of display technologies, and in particular, to a display and an electronic device.

BACKGROUND

Self-luminous displays, such as organic light emitting diode (OLED) displays, have attracted extensive attention and have been greatly developed for a long time due to advantages such as self-luminescence, fast reaction, high brightness, and lightness. However, in an existing self-luminous display, due to large leakage currents of some transistors in a pixel circuit, power consumption is relatively high in a scenario of low-frequency driving, for example, in a standby state. As a result, a standby time of a device is reduced.

SUMMARY

Embodiments of this application provide a display and an electronic device, to improve a problem of large power consumption of a self-luminous display under low-frequency driving.

According to a first aspect of an embodiment of this application, a display is provided. The display includes a plurality of sub pixels, a substrate, a light-emitting device, a pixel circuit, and an isolation portion. The light-emitting device, the pixel circuit, and the isolation portion are disposed on the substrate. The pixel circuit and the light-emitting device are coupled, and are located in the sub pixel. The pixel circuit includes a first transistor and a second transistor. An active layer of the first transistor includes polycrystalline silicon, and an active layer of the second transistor includes a semiconductor oxide. In addition, the isolation portion includes an isolation base and an isolation retaining wall surrounding the isolation base. The active layer of the second transistor is disposed in a groove formed by the isolation retaining wall and the isolation base. The isolation portion is configured at least to block hydrogen ions in the active layer of the first transistor from being diffused into the active layer of the second transistor.

It will be appreciated from the foregoing description that, the first transistor is a polycrystalline silicon thin-film transistor, and the second transistor is an oxide thin-film transistor. The isolation portion is composed of the isolation retaining wall and the isolation base. The isolation retaining wall and the isolation base form a groove. Moreover, the active layer of the second transistor is disposed in the groove formed by the isolation retaining wall and the isolation base, and the active layer of the first transistor is disposed outside the groove formed by the isolation retaining wall and the isolation base. Therefore, the isolation portion may be configured to block the hydrogen ions in the active layer of the first transistor from being diffused into the active layer of the second transistor, thereby avoiding a failure of the oxide thin-film transistor after the hydrogen ions in the low-temperature polycrystalline silicon thin-film transistor are diffused into the active layer of the oxide thin-film transistor. In this case, the pixel circuit includes the low-temperature polycrystalline silicon thin-film transistor, and also includes the oxide thin-film transistor. Moreover, the oxide thin-film transistor has a lower off-state current as compared with the low-temperature polycrystalline silicon thin-film transistor. Therefore, during low-frequency driving, power consumption can be reduced, and therefore a standby time can be increased.

Optionally, the display further includes a first gate insulation layer, a first passivation layer, a second passivation layer, and a second gate insulation layer that are sequentially located on the substrate. Materials constituting the first passivation layer include silicon nitride, and materials constituting the second passivation layer include silicon oxide. In addition, the first gate insulation layer is located between the active layer of the first transistor and a first gate, and the active layer of the first transistor is close to the substrate. Moreover, the first gate of the first gate insulation layer is covered by the first passivation layer and the second passivation layer.

In this case, the isolation retaining wall at least penetrates the first gate insulation layer and the first passivation layer, and at least a portion of the second gate insulation layer is located in the isolation retaining wall. In addition, the second gate insulation layer is located between the active layer of the second transistor and a second gate, and the active layer of the second transistor is close to the substrate.

In this way, the isolation retaining wall not only blocks the hydrogen ions in the active layer of the first transistor, but also blocks hydrogen ions in the silicon nitride of the first passivation layer from being diffused into the active layer of the second transistor, thereby avoiding damage caused by the hydrogen ions to the active layer of the second transistor. In addition, the isolation retaining wall at least disconnects the first gate insulation layer from the first passivation layer. Therefore, stress concentration due to an excessively large area of an inorganic oxide material can be avoided. In this way, an internal fracture is avoided when the display is bent.

Optionally, the isolation retaining wall further penetrates the second passivation layer. In this case, the isolation retaining wall penetrates the first gate insulation layer, the first passivation layer, and the second passivation layer. The isolation retaining wall is higher than that in the foregoing solution, and therefore can better block the hydrogen ions in the active layer of the first transistor and the hydrogen ions in the silicon nitride of the first passivation layer from being diffused into the active layer of the second transistor.

Optionally, the display further includes a common electrode layer. The common electrode layer is located on a side, of the first transistor and the second transistor, that is close to the substrate. A first pole of the first transistor or the second transistor is coupled to the common electrode layer. On this basis, first, the common electrode layer is located on the side, of the first transistor and the second transistor, that is close to the substrate, and is not at a same layer with a source/drain (S/D). Therefore, voltage drop (IR drop) can be reduced, thereby avoiding crosstalk of a data line. In addition, layout space of the data line is reduced, and resolution is improved. Second, the common electrode layer is not located at a position of an upper laminated layer. In this case, a thickness of the laminated layer can be reduced, thereby facilitating continuous bending of the display.

In addition, the isolation base and the common electrode layer are at a same layer, made of a same material, and integrally formed. In this way, a fabrication process can be simplified. The isolation base is formed by using a same mask while the common electrode layer is fabricated.

Optionally, the common electrode layer includes a metal layer, or includes a metal layer and a surface oxide material layer stacked with the metal layer. In this case, a vertical projection, of the active layer of the first transistor, on the substrate is within a range of a vertical projection, of the common electrode layer, on the substrate. Moreover, a vertical projection, of the active layer of the second transistor, on the substrate is within the range of the vertical projection, of the common electrode layer, on the substrate. In this way, the common electrode layer can shelter the active layer of the first transistor and the active layer of the second transistor from being damaged by ambient light, laser lift off (LLO), and other processes during processing. In addition, the common electrode layer is made of a metal material, and therefore can shield entry of an external electric field and electrostatic discharge (ESD), thereby improving stability of the light-emitting device.

Optionally, the first transistor further includes a third gate. The third gate is located on a side that is of the first gate of the first transistor and that is close to the substrate, and the first gate in the first transistor is insulated from the third gate. In addition, the third gate of the first transistor is at a same layer and made of a same material as the common electrode layer, and is insulated from the common electrode layer. On this basis, the third gate may be formed by using a same mask while the common electrode layer is fabricated, and therefore a process is simplified. In addition, as compared with a single gate, a driving capability of a transistor can be improved through two gates.

Optionally, the second transistor further includes a fourth gate. The fourth gate is located on a side that is of the second gate of the second transistor and that is close to the substrate, and the second gate in the second transistor is insulated from the fourth gate. In addition, the fourth gate of the second transistor is at a same layer and made of a same material as the common electrode layer, and is insulated from the common electrode layer. On this basis, the fourth gate may be formed by using a same mask while the common electrode layer is fabricated, and therefore a process is simplified. In addition, as compared with a single gate, a driving capability of a transistor can be improved through two gates.

Optionally, materials constituting the substrate include an organic material. In this case, the display further includes a first barrier layer, a first stress relief layer, and a second barrier layer that are sequentially located on the substrate. The active layer of the first transistor is located on a surface of a side that is of the second barrier layer and that is away from the substrate. In addition, the common electrode layer is located between the first barrier layer and the first stress relief layer, and is connected to the first barrier layer and the first stress relief layer. In this case, the common electrode layer can provide a function of supporting the display. For a flexible display, stress on a panel of the display can be made uniform, thereby implementing a continuous bending effect. In addition, a problem of film deformation and scattered bright spots during a production process is improved.

Optionally, the display may further include a first via. The first via sequentially penetrates the first stress relief layer, the second barrier layer, the first gate insulation layer, and the first passivation layer. In addition, a first end of the first via is coupled to the common electrode layer, and a second end of the first via is coupled to the first pole of the first transistor or the second transistor. The first via includes a first metal conductive layer, and the isolation retaining wall and the first metal conductive layer are at a same layer and made of a same material. In this case, the first metal conductive layer may be formed by using a same mask while the isolation retaining wall is fabricated, and therefore a process is simplified.

Optionally, the display further includes a second via. A first end of the second via is coupled to the second end of the first via, and a second end of the second via is coupled to the first pole of the first transistor or the second transistor. In addition, the first via includes a second metal conductive layer, and the second metal conductive layer and the first pole of the first transistor are at a same layer and made of a same material. In this case, the second metal conductive layer may also be formed by using a same mask while the first pole of the first transistor is fabricated, and therefore a process is simplified. In addition, coupling with the common electrode layer can be implemented by connecting the first via to the second via, and this can reduce process difficulty.

Optionally, materials constituting the substrate include an organic material. The display further includes a first barrier layer, a connection layer, and a first stress relief layer that are sequentially located on the substrate. The connection layer is configured to connect the first barrier layer to the first stress relief layer. In addition, the common electrode layer is located between the substrate and the first barrier layer, and is connected to the substrate and the first barrier layer. Alternatively, the display further includes a second barrier layer that is located on a side that is of the first stress relief layer and that is away from the substrate, and the active layer of the first transistor is located on a surface of a side that is of the second barrier layer and that is away from the substrate. The common electrode layer is located between the first stress relief layer and the second barrier layer, and is connected to the first stress relief layer and the second barrier layer. In this case, the common electrode layer can also provide a function of supporting the display. For a flexible display, stress on a panel of the display can be made uniform, thereby implementing a continuous bending effect. In addition, a problem of film deformation and scattered bright spots during a production process is improved.

Optionally, in the isolation retaining wall, the active layer of the second transistor is insulated from the isolation base, and the second barrier layer is disposed on an outer surface that is of the isolation retaining wall and that is away from the active layer of the second transistor.

In this way, first, the active layer of the second transistor may be separated from the isolation base, to avoid electrical connection. Second, a thickness of the second barrier layer is usually much greater than thicknesses of the second passivation layer and the second gate insulation layer. Therefore, when the second barrier layer is disposed on the outer surface that is of the isolation retaining wall and that is away from the active layer of the second transistor, the active layer of the second transistor can be located in the isolation portion, and can be lower than the active layer of the first transistor.

Optionally, materials constituting the substrate include an inorganic material. The display further includes a buffer layer located on the substrate. The common electrode layer is located between the substrate and the buffer layer, and is connected to the substrate and the buffer layer. In addition, the active layer of the second transistor is insulated from the isolation base, and the buffer layer is disposed on an outer surface that is of the isolation retaining wall and that is away from the active layer of the second transistor. On this basis, for a display whose substrate materials include an inorganic material, the common electrode layer may also be used to provide functions of sheltering the active layer of the first transistor and the active layer of the second transistor from being damaged by external light, laser lift off (LLO), and other processes, and shielding entry of an external electric field and electrostatic discharge (ESD). In addition, a thickness of the buffer layer is usually much greater than thicknesses of the second passivation layer and the second gate insulation layer. Therefore, when the buffer layer is disposed on the outer surface that is of the isolation retaining wall and that is away from the active layer of the second transistor, the active layer of the second transistor can be located in the isolation portion, and can be lower than the active layer of the first transistor.

Optionally, the pixel circuit further includes a storage capacitor, and the storage capacitor includes a first electrode and a second electrode that are insulated. The first electrode is located on a surface of a side that is of the first gate insulation layer and that is away from the substrate, and first electrode and a gate of the first transistor are at a same layer and made of a same material. In addition, the second electrode is located on a surface of a side that is of the second passivation layer and that is away from the substrate; the second electrode is coupled to the first transistor; and the second electrode and a gate of the second transistor are at a same layer and made of a same material. In this case, the first electrode and the second electrode of the storage capacitor may be fabricated separately by using a same mask while the gate of the first transistor and the gate of the second transistor are fabricated, and therefore a process is simplified.

Optionally, the display further includes a third passivation layer that covers the second gate insulation layer, and the storage capacitor further includes a third electrode. The third electrode is located on a surface of a side that is of the third passivation layer and that is away from the substrate, and covers the second electrode. The third electrode and a first pole of the first transistor are at a same layer and made of a same material. In addition, the display further includes a third via that penetrates the second electrode, and the third electrode is coupled to the first electrode through the third via. On this basis, first, the third passivation layer can block hydrogen ions in the air from being diffused into the active layer of the second transistor during a production process, thereby avoiding damage to the active layer of the second transistor. Second, the foregoing structure can increase a relative area of the capacitor, thereby enhancing an energy storage effect of the capacitor.

Optionally, the first transistor is coupled to the light-emitting device. The first transistor is configured to supply a driving current to the light-emitting device, to quickly turn on the light-emitting device.

According to a second aspect of an embodiment of this application, an electronic device is provided. The electronic device includes any display described above. The electronic device has the same technical effects as the display provided in the foregoing embodiment. Details are not described herein again.

BRIEF DESCRIPTION OF DRAWINGS

FIG. 1B is a schematic diagram of a structure of a display in the electronic device in FIG. 1a;

REFERENCE NUMERALS

Figure 1A:
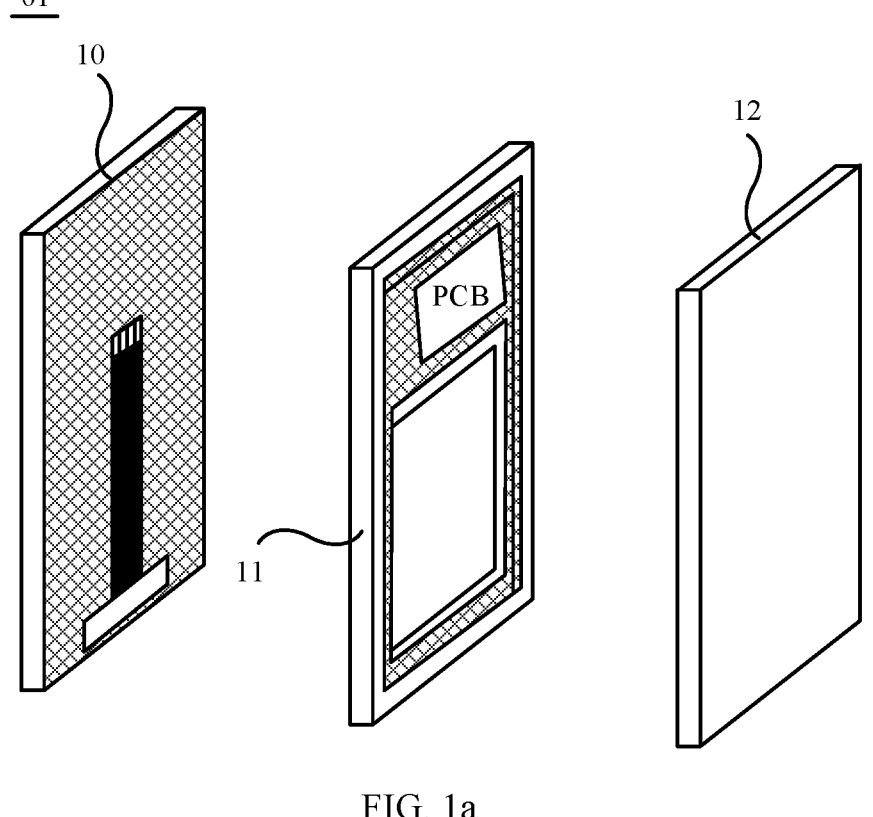
FIG. 1a is a schematic diagram of a structure of an electronic device according to an embodiment of this application.

01: electronic device; 10: display module; 11: middle frame; 12: rear cover; 100: display; 101: pixel circuit; 102: light-emitting part; 103: sub pixel; s: source; d: drain; g: gate; AL: active layer; GL: gate line; Td: driving transistor; Tc: switching transistor; 215: pixel definition layer; 216: anode; 217: light: emitting layer; 218: cathode; 225: hollow-out structure; 219: second pole of a first transistor; 222: first gate; 212: active layer of the first transistor; 201: substrate; 202: first transistor; 203: second transistor; 223: second gate; 210: third passivation layer; 208: second gate insulation layer; 207: second passivation layer; 206: first passivation layer; 205: first gate insulation layer; 213: active layer of the second transistor; 214: isolation retaining wall; 224: isolation base; 204: isolation portion; 301: first barrier layer; 302: first stress relief layer; 303: second barrier layer; 228: groove; 305: first via; 306: second via; 307: first metal conductive layer; 308: second metal conductive layer; 304: common electrode layer; A: first electrode; B: second electrode; E: first end of the first via; F: first end of the second via; Cst: storage capacitor; C: third electrode; D: third via; 309: third gate; 310: fourth gate; 311: connection layer; 601: buffer layer.

DESCRIPTION OF EMBODIMENTS

The following describes technical solutions in embodiments of this application with reference to the accompanying drawings. It will be appreciated that the described embodiments are merely some rather than all of embodiments of this application.

The following terms "first" and "second" are merely intended for a purpose of description, and shall not be understood as an indication or implication of relative importance or implicit indication of a quantity of indicated technical features. Therefore, a feature limited by "first", "second", or the like may explicitly or implicitly include one or more features. In the descriptions of this application, unless otherwise stated, "a plurality of" means two or more than two.

In addition, in this application, directional terms such as "up" and "down" may include but are not limited to directions of schematically placed components in relative accompanying drawings. It should be understood that these directional terms may be relative concepts. The directional terms are used for relative description and clarification, and may vary correspondingly based on a change in a direction in which the component is placed in the accompanying drawings.

In this application, the term "connection" should be understood in a broad sense unless otherwise expressly specified and limited. For example, the "connection" may be a fixed connection, may be a detachable connection, may be an integral connection; may be a direct connection, or may be an indirect connection implemented by using a medium. In addition, the term "coupling" may be a manner of implementing an electrical connection for signal transmission. The "coupling" may be a direct electrical connection, or may be an indirect electrical connection through an intermediate medium.

An embodiment of this application provides an electronic device. The electronic device includes an electronic product such as a mobile phone, a tablet computer (pad), a computer, a smart wearable product (for example, a smartwatch or a smart band), a set-top box, a media player, a portable electronic device, a virtual reality (VR) terminal device, or an augmented reality (AR) terminal device. A specific form of the electronic device is not particularly limited in this embodiment of this application.

For ease of description, an example in which an electronic device 01 is a mobile phone shown in FIG. 1a is used below. In this case, the electronic device 01 mainly includes a display module 10, a middle frame 11, and a rear cover 12. The middle frame 11 is located between the display module 10 and the rear cover 12. The display module 10 and the rear cover 12 are separately connected to the middle frame 11. An accommodating cavity formed between the rear cover 12 and the middle frame 11 is configured to accommodate electronic components such as a battery and a camera, and a printed circuit board (PCB) shown in FIG. 1a.

Figure 1B:
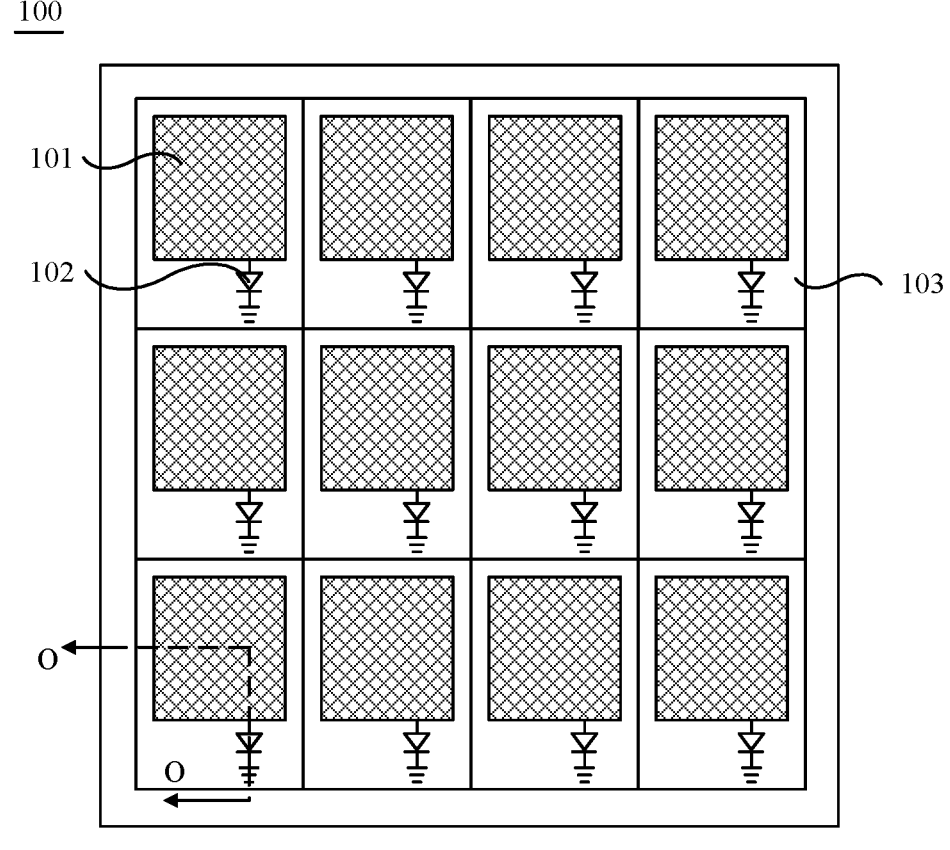

For any electronic device 01 described above, the display module 10 in the electronic device 01 may include a display 100 shown in FIG. 1B. The display 100 may include a plurality of sub pixels 103 arranged in rows and columns. A pixel circuit 101 and a light-emitting device 102 are located in the sub pixel 103. The pixel circuit 101 drives the light-emitting device 102 to emit light, so that each sub pixel 103 in the display 100 can be displayed according to a preset gray scale.

For example, the light-emitting device 102 may be an organic light-emitting diode (OLED), a micro light-emitting diode (micro LED), or a mini light-emitting diode (mini LED). For ease of description, descriptions are made below by using an example in which the light-emitting device 102 is an OLED.

In some embodiments of this application, the pixel circuit 101 may include a plurality of transistors and at least one capacitor. The transistor may be a thin-film transistor (TFT).

Figure 1C:
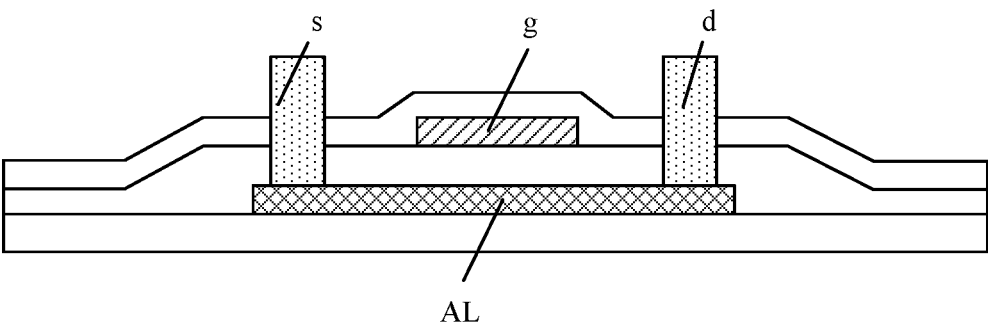
FIG. 1c is a schematic diagram of a structure of a transistor according to an embodiment of this application.

Any one of the foregoing transistors may include a gate (g), an active layer (AL), a first pole and a second pole is, which is, for example, a drain (d) that are shown in FIG. 1c (a cross-sectional view of the transistor). For example, the first pole is a source (s), and the second pole is a drain (d). Alternatively, the first pole of the transistor may be the drain d, and the second pole may be the source s. This is not limited in this application. For ease of description, the following provides descriptions by using an example in which the first pole of the transistor is the source s and the second pole is the drain d.

The active layer AL is made of a semiconductor material. When the transistor can be turned on by using a voltage applied to the gate g of the transistor, the active layer AL is converted from an insulator into a conductor, so that the source s and the drain g of the transistor are coupled. When the transistor cannot be turned on by using a voltage applied to the gate g of the transistor, the active layer AL is in an insulated state, and the source s of the transistor is disconnected from the drain d thereof.

Performance of the transistor varies with different materials constituting the active layer of the transistor. For example, when the material constituting the active layer of the transistor is polycrystalline silicon (for example, low temperature polycrystalline silicon, LTPS), due to high electron mobility of the polycrystalline silicon transistor, the polycrystalline silicon transistor is usually applied to a case with a high switching frequency (for example, the electronic device 01 is in an on state), to improve switching efficiency. It should be noted that the low temperature polycrystalline silicon is polycrystalline silicon deposited in an environment with a low temperature (for example, a temperature lower than 600° C.).

Alternatively, for another example, when the material constituting the active layer of the transistor is a semiconductor oxide (for example, an amorphous indium gallium zinc oxide, or an indium gallium zinc oxide, IGZO), because the semiconductor oxide transistor has lower electron mobility than a polycrystalline silicon transistor, but has an extremely low off-state current, the semiconductor oxide transistor is usually applied to a case with a low switching frequency (for example, the electronic device 01 is in a standby state), and may be configured to reduce a leakage current, thereby reducing power consumption. Hereinafter, for ease of description, a transistor whose active layer is made of polycrystalline silicon is referred to as a first transistor, and a transistor whose active layer is made of a semiconductor oxide is referred to as a second transistor.

Figure 2A:
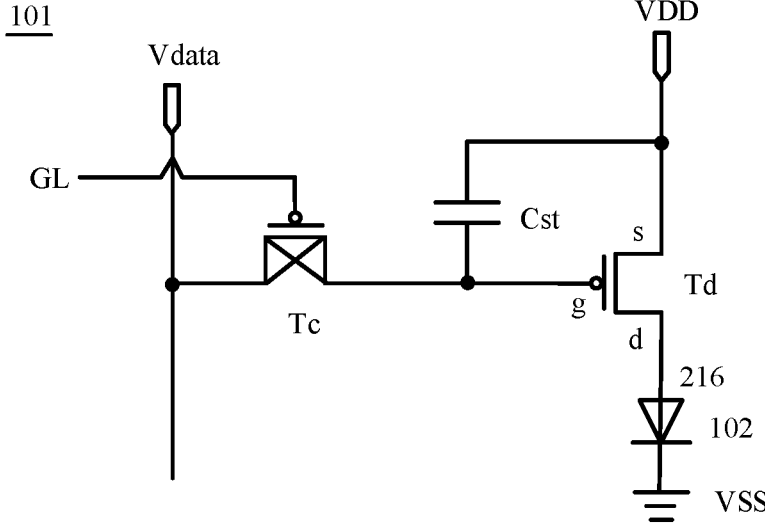
FIG. 2a is a circuit diagram of a pixel circuit according to an embodiment of this application.

On this basis, to enable the pixel circuit 101 to be turned on quickly under high-frequency driving (for example, the electronic device 01 is in the on state), and to reduce power consumption under low-frequency driving (for example, the electronic device 01 is in the standby state), the pixel circuit 101 includes at least one first transistor and at least one second transistor that are described above. For example, as shown in FIG. 2a, the pixel circuit 101 may include a driving transistor Td, a switching transistor Tc, and a capacitor Cst. In this case, the pixel circuit 101 has a 2T1C structure. "2T" indicates that there are two transistors and "1C" indicates that there is one storage capacitor.

The switching transistor Tc is configured to stay in an on state under control of a gate line (GL), so as to write a data voltage Vdata in a gate g of the driving transistor Td and the storage capacitor Cst. The storage capacitor Cst may maintain a gate voltage of the driving transistor Td, so that the gate voltage of the driving transistor Td can be stabilized within one image frame. In this case, the driving transistor Td can generate a driving current based on the data voltage Vdata, so that the light-emitting device 102 can emit light based on the driving current.

In some embodiments of this application, the driving transistor Td in FIG. 2a may be the first transistor. For example, an active layer of the driving transistor Td is made of LTPS. In addition, the switching transistor Tc may be the second transistor. For example, an active layer of the switching transistor is made of IGZO. In this case, because the driving transistor Td (that is, the first transistor) has high electron mobility, the light-emitting device 102 can be quickly turned on when the first transistor is connected to the light-emitting device 102. Moreover, because an off-state current of the second transistor is extremely low, when the second transistor is used as the switching transistor Tc to control on or off of a circuit, a leakage current can be reduced, thereby reducing power consumption and increasing a standby time of the device.

Alternatively, in some other embodiments of this application, the driving transistor Td in FIG. 2a may be the second transistor. For example, an active layer of the driving transistor Td is made of IGZO. In addition, the switching transistor Tc may be the first transistor. For example, an active layer of the switching transistor Tc is made of LTPS.

In addition, manners for disposing the active layer of the transistor in the pixel circuit are described above by using an example in which the pixel circuit 101 has a 2T1C structure. In some other embodiments of this application, to eliminate impact of a threshold voltage (Vth) of the driving transistor Td on luminance of the light-emitting device 102 and improve uniformity of the luminance of the light-emitting device, a compensation and initialization module may be added to the pixel circuit. In this case, a quantity of switching transistors may be increased. For example, the pixel circuit has a 7T1C or an 8T1C structure. The pixel circuit 101 has at least one first transistor (for example, the active layer is made of LTPS) and at least one second transistor (for example, the active layer is made of IGZO). For ease of description, the following provides descriptions by using an example in which the pixel circuit 101 has a 2T1C structure and the driving transistor Td in the pixel circuit 101 is the first transistor (for example, the active layer is made of LTPS), and the switching transistor Tc is the second transistor (for example, the active layer is made of IGZO).

The following details a structure of the display 100 having the pixel circuit 101, that is, the pixel circuit 101 includes a first transistor (for example, the active layer is made of LTPS) and a second transistor (for example, the active layer is made of IGZO).

Figure 2B:
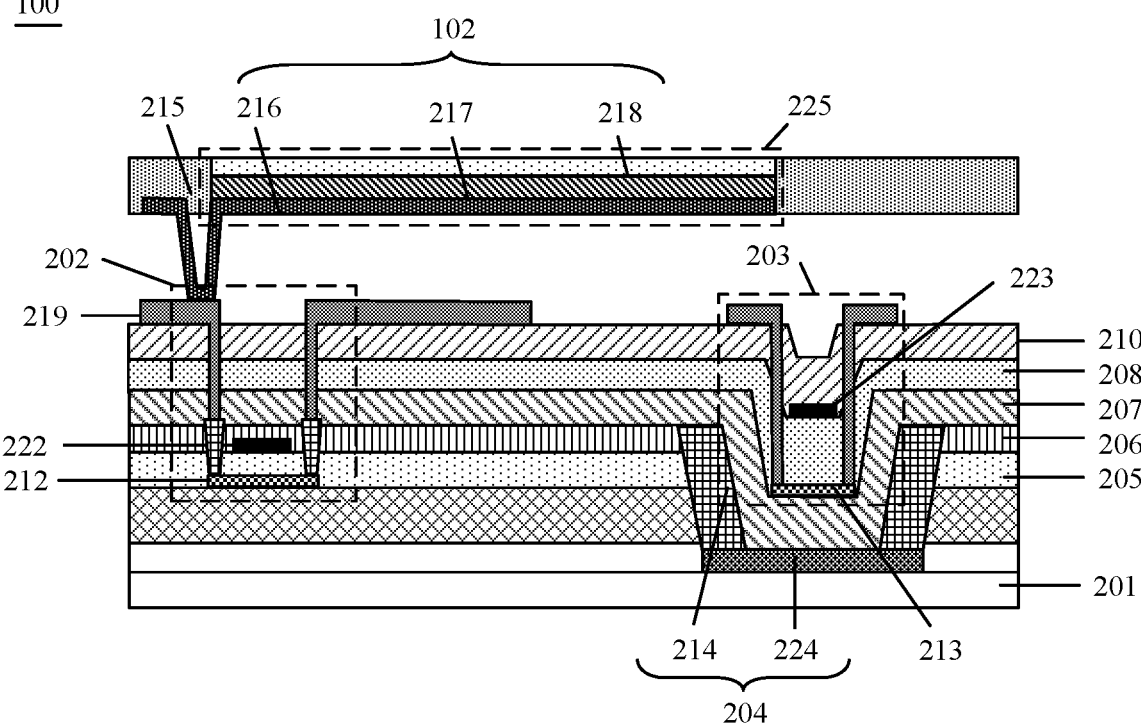
FIG. 2b is a sectional view obtained by cutting along O-O in FIG. 1b.

As shown in FIG. 2b (a sectional view obtained by cutting along the dashed line O-O in FIG. 1B), the display 100 may include a substrate 201, and a first transistor (for example, an active layer is made of LTPS) 202 and a second transistor (for example, an active layer is made of IGZO) 203 that are disposed on the substrate 201.

In this embodiment of this application, materials constituting the substrate 201 may include a rigid material, for example, at least one of glass, sapphire, or a metal material. Alternatively, materials constituting the substrate 201 may include a flexible material, such as a macromolecular polymer material.

The first transistor 202 serves as the driving transistor Td shown in FIG. 2a. A second pole, for example, a drain d, of the first transistor 202 may be coupled to an anode 216 (anode) of the light-emitting device 102. Therefore, as shown in FIG. 2b, the anode 216 of the light-emitting device 102 is in contact with the second pole 219, for example, the drain d, of the first transistor 202. In addition, the light-emitting device 102 further includes a light-emitting layer 217 and a cathode 218 that are sequentially located above the anode 216. In addition, the display 100 further includes a pixel definition layer (PDL) 215. The pixel definition layer 215 has a plurality of hollow-out structures 225. One light-emitting device 102 may be disposed in a hollow-out structure 225.

It will be appreciated from the foregoing description that, the first transistor 202 includes a gate, a first pole (for example, a source s), a second pole (for example, a drain d), and an active layer AL. In some embodiments of this application, as shown in FIG. 2b, a first gate insulation layer 205 (for example, a silicon oxide SiOx layer) is disposed between a first gate 222 and an active layer 212 of the first transistor 202. Moreover, the first gate 222 is disposed farther from the substrate 201 than the first gate insulation layer 205. Therefore, in FIG. 2b, the first transistor 202 is a top-gate transistor. In addition, a first passivation layer 206, a second passivation layer 207, and a second gate insulation layer 208 sequentially cover the first gate 222. Materials constituting the first passivation layer 206 include silicon nitride (SiNx), and materials constituting the second passivation layer 207 include silicon oxide (SiOx).

Similarly, the second gate insulation layer 208 is disposed between an active layer 213 and a second gate 223 of the second transistor 203, and the active layer 213 of the second transistor 203 is close to the substrate 201. Therefore, the second transistor 203 is also a top-gate transistor.

Materials constituting the first gate 222 and the second gate 223 may be metal materials such as molybdenum (Mo), titanium/aluminum/titanium alloy (Ti/Al/Ti), molybdenum/ aluminum/molybdenum alloy (Mo/Al/Mo), and titanium (Ti).

It will be appreciated from the foregoing description that, the active layer 212 of the first transistor 202 is made of polycrystalline silicon. To improve electrical performance of the first transistor 202, usually, hydrogen ions are used to fill unsaturated bonds or dangling bonds in the polycrystalline silicon of the active layer 212 of the first transistor 202 by using a hydrogenation process (for example, a solid-state diffusion method, where silicon nitride (that is, the first passivation layer 206) is used as a hydrogenation source, and the hydrogen ions are diffused into the active layer 212 at a high temperature). In this way, a quantity of unstable states in the polycrystalline silicon is reduced, thereby improving electron mobility and improving threshold voltage uniformity.

Moreover, the active layer 213 of the second transistor 203 is made of a semiconductor oxide, and the active layer 213 of the second transistor 203 may be damaged by hydrogen ions. Therefore a width of a forbidden band of the active layer 213 of the second transistor 203 is reduced or even becomes invalid. Therefore, to prevent the hydrogen ions in the first transistor 202 from being diffused into the active layer 213 of the second transistor 203, in the embodiments of this application, the display 100 may further include an isolation portion 204 disposed on the substrate 201.

As shown in FIG. 2b, the isolation portion 204 may include an isolation base 224 and an isolation retaining wall 214 surrounding the isolation base 224. The isolation retaining wall 214 penetrates at least the first gate insulation layer 205 and the first passivation layer 206, and at least a portion of the second gate insulation layer 208 is located in the isolation retaining wall 214. The active layer 213 of the second transistor 203 is located on a side that is of the second gate insulation layer 208 and that is close to the substrate 201. Therefore, the active layer 213 of the second transistor 203 is disposed in a groove formed by the isolation retaining wall 214 and the isolation base 224. However, it will be appreciated from the foregoing description that, the active layer 212 of the first transistor 202 adjacent to the second transistor 203 is disposed outside the groove formed by the isolation retaining wall 214 and the isolation base 224. In this way, in one aspect, the isolation retaining wall 214 can block hydrogen ions in the active layer 212 of the first transistor 202 from being diffused into the active layer 213 of the second transistor 203. Moreover, when the active layer 212 of the first transistor 202 is hydrogenated by using a solid-state diffusion method (for example, silicon nitride (that is, the first passivation layer 206) is used as a hydrogenation source, and the hydrogen ions are diffused into the active layer 212 at a high temperature), the first passivation layer 206 also has a relatively high content of hydrogen ions. In this case, the isolation retaining wall 214 can further block hydrogen ions in the silicon nitride of the first passivation layer 206 from being diffused into the active layer 213 of the second transistor 203. In this way, the active layer 213 of the second transistor 203 is prevented from being damaged by the hydrogen ions. In this way, when the pixel circuit 101 includes both an LTPS transistor and an IGZO transistor, because the IGZO transistor has an extremely low off-state current as compared with the LTPS transistor, power consumption can be reduced during low-frequency driving (for example, when the pixel circuit 101 is applied to a display of a mobile phone, 1 Hz driving can be implemented, and power consumption can be reduced by 15% as compared with a device in which the pixel circuit 101 uses LTPS only), and a standby time can be increased (for example, when the pixel circuit 101 is applied to a wearable product, an ultra-long standby time of for one month can be implemented).

In another aspect, the isolation retaining wall 214 disconnects at least the first gate insulation layer 205 (for example, SiOx) from the first passivation layer 206 (SiNx). Therefore, stress concentration due to an excessively large area of an inorganic nitrogen oxide material can be avoided. In this way, a problem of an internal fracture is avoided when the display is bent.

In addition, in some embodiments of this application, the display 100 may further include a third passivation layer 210 that covers the second gate insulation layer 208. Materials constituting the third passivation layer 210 may include silicon oxide (SiOx). The third passivation layer 210 covers a surface of the second transistor 203, and the second gate 223 is located on a side that is of the active layer 213 of the second transistor 203 and that is away from the substrate 201. Therefore, the third passivation layer 210 and the second gate 223 may be further configured to block hydrogen ions in the air from being diffused into the active layer 213 of the second transistor 203 during a production process, thereby avoiding damage to the active layer 213 of the second transistor 203.

The structure of the display 100 having the foregoing isolation portion 204 is described below by using examples.

Example 1

Figure 3:
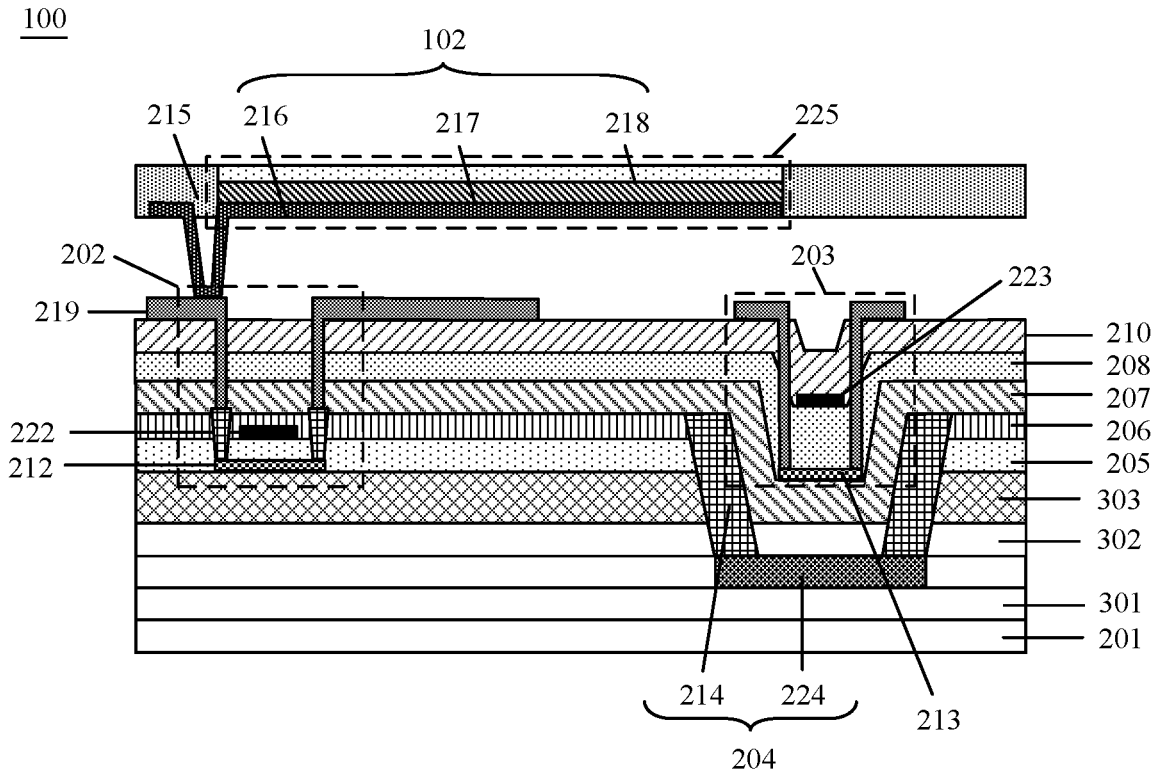
FIG. 3 is a schematic diagram of a structure of another display according to an embodiment of this application.

In this example, the display 100 is a flexible display. As shown in FIG. 3, the materials constituting the substrate 201 include an organic material, such as polyimide (PI). The display 100 further includes a first barrier layer 301 (for example, silicon oxide, SiOx), a first stress relief layer 302 (for example, PI), and a second barrier layer 303 (for example, silicon oxide, SiOx) that are sequentially located on the substrate 201.

In some embodiments of this application, a process of fabricating the display 100 having a structure of the isolation portion 204 is as follows.

Figure 4A:
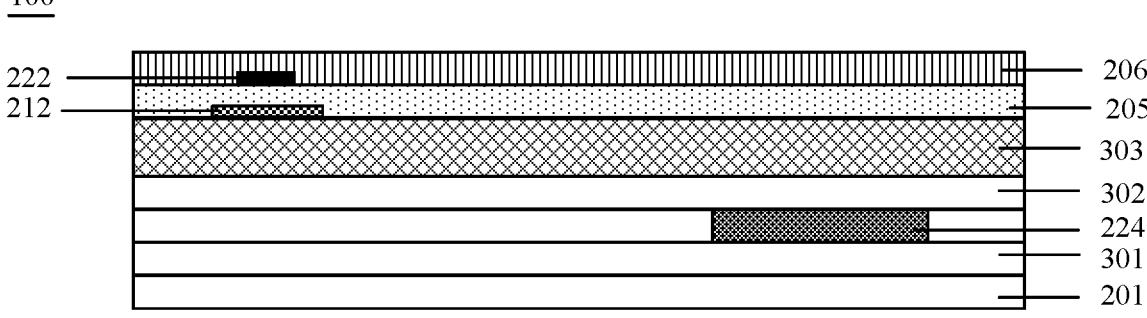
FIG. 4a is a schematic diagram of a structure of another display according to an embodiment of this application.

First, as shown in FIG. 4a, the first barrier layer 301 is formed on the substrate 201 through chemical vapor deposition (CVD), and then the isolation base 224 is formed on a surface of the first barrier layer 301 through physical vapor deposition (PVD).

Subsequently, the first stress relief layer 302 is coated on the isolation base 224 by using a coating process, and then the second barrier layer 303 is formed, by using a CVD process, on the substrate on which the first stress relief layer 302 is fabricated. It should be noted that the isolation base 224 may be disposed on any layer between the substrate 201 and the second barrier layer 303. For ease of description, in this example, the isolation base 224 is disposed between the first barrier layer 301 and the first stress relief layer 302.

Subsequently, the active layer 212 of the first transistor 202 is formed on a surface of a side that is of the second barrier layer 303 and that is away from the substrate 201. Afterwards, the active layer 212 of the first transistor 202 is covered by the first gate insulation layer 205, and then the first gate 222 is formed, by using a PVD process, on a surface of a side that is of the first gate insulation layer 205 and that is away from the substrate 201. Then, the first passivation layer 206 is covered on the first gate 222.

Figure 4B:
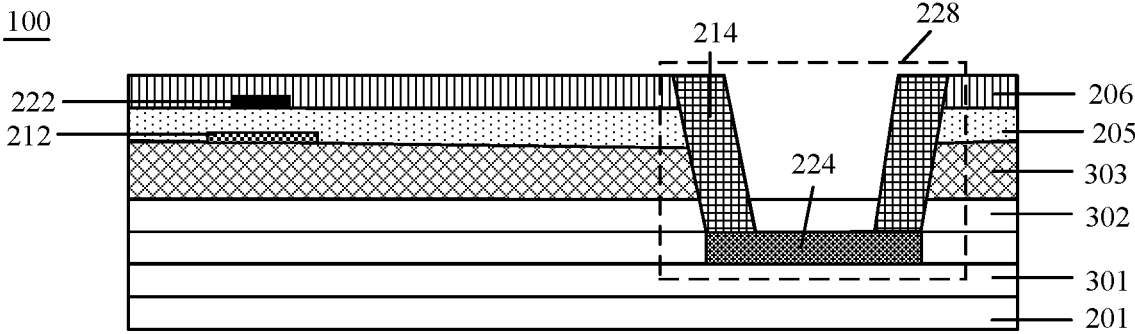
FIG. 4b is a schematic diagram of a structure of another display according to an embodiment of this application.

In this case, as shown in FIG. 4b, a groove 228 may be formed on one side (for example, the right side) of the first transistor 202 by using a dry etching process. A fully transparent mask may be first used to etch a position on a side that is of the first stress relief layer 302 and that is away from the substrate 201. Subsequently, a semi-transparent mask is used, so that the first stress relief layer 302 in the groove 228 is retained, and a position at which the isolation retaining wall 214 is located is etched. The isolation retaining wall 214 communicates with the isolation substrate 224. Subsequently, the isolation retaining wall 214 is formed on a side wall of the groove 228 by using the PVD process, so that the isolation retaining wall 214 is electrically connected to the isolation base 224.

It should be noted that a material constituting the isolation portion 204 may be titanium/aluminum/titanium (Ti/Al/Ti), molybdenum/aluminum/molybdenum (Mo/Al/Mo), molybdenum (Mo), copper (Cu), or the like. Materials of the isolation base 224 and the isolation retaining wall 214 may be the same or may be different.

Because the material constituting the isolation base 224 is a metal material, as shown in FIG. 3, the active layer 213 of the second transistor 203 needs to be isolated from the isolation base 224 by using at least one insulation layer. In some embodiments of this application, as shown in FIG. 3, the second passivation layer 207 and the first stress relief layer 302 are disposed between the active layer 213 of the second transistor 203 and the isolation base 224. Therefore, as shown in FIG. 4b, during forming of the groove 228, when an electrical connection between the isolation retaining wall 214 and the isolation base 224 is ensured, at least a portion of each of the second barrier layer 303, the first gate insulation layer 205, and the first passivation layer 206 that are located at a bottom of the groove 228 may be etched, so that the active layer 213 is insulated from the isolation base 224 by using the second passivation layer 207 and the first stress relief layer 302.

It should also be noted that, when the groove 228 is formed on one side (for example, the right side) of the first transistor 202 by using the dry etching process, and when the active layer 213 of the second transistor 203 is insulated from the isolation base 224, the second barrier layer 303 further needs to be disposed on an outer surface that is of the isolation retaining wall 214 and that is away from the active layer 213 of the second transistor 203 (as shown in FIG. 4*b*). Because a thickness of the second barrier layer 303 is usually greater than thicknesses of the first passivation layer 206 and the second passivation layer 207, when the second barrier layer 303 is disposed on the outer surface that is of the isolation retaining wall 214 and that is away from the active layer 213 of the second transistor 203, the active layer 213 of the second transistor 203 may be made lower than the active layer 212 of the first transistor 202, thereby better blocking hydrogen ions from being diffused into the active layer 213 of the second transistor 203. Alternatively, a first thickness of a portion, of the second barrier layer 303, that is located on the isolation retaining wall 214 and that is close to the active layer 213 of the second transistor 203 may be made less than a second thickness of a portion, of the second barrier layer 303, that is located on the isolation retaining wall 214 and that is away from the active layer 213 of the second transistor 203. The thickness is a length in a direction in which the second barrier layer 303 grows when the second barrier layer 303 is deposited on the substrate 201. In this case, a size of the first thickness may be adjusted, so that the active layer 213 of the second transistor 203 is insulated from the isolation base 224, and the active layer 213 of the second transistor 203 is lower than the active layer 212 of the first transistor 202, thereby better blocking hydrogen ions from being diffused into the active layer 213 of the second transistor 203.

Figure 4C:
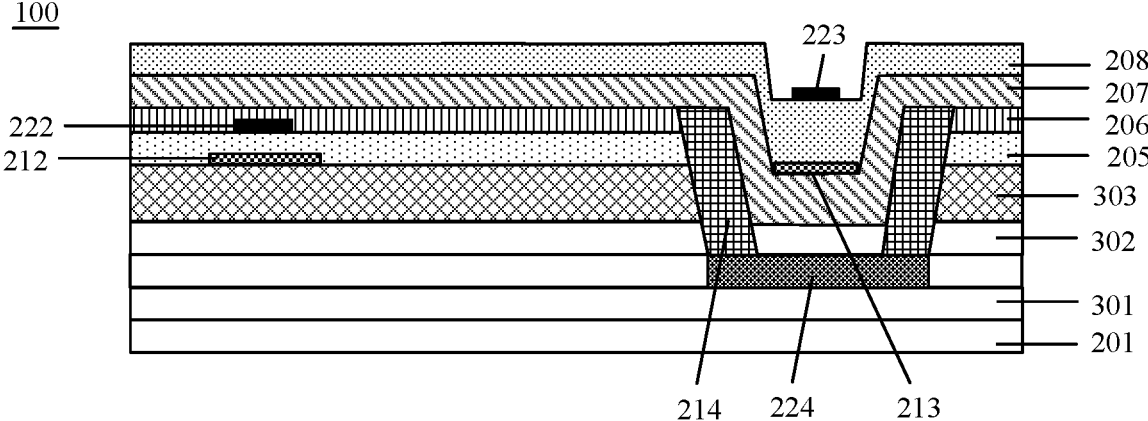
FIG. 4c is a schematic diagram of a structure of another display according to an embodiment of this application.

Subsequently, as shown in FIG. 4*c*, the second passivation layer 207 and the second gate insulation layer 208 are sequentially formed, by using the CVD process, on a surface of a side that is of the first passivation layer 206 and that is away from the substrate 201. In this case, a portion of the second passivation layer 207 and a portion of the second gate insulation layer 208 are located in the isolation retaining wall 214. Afterwards, the active layer 213 and the second gate 223 of the second transistor 203 are respectively formed on two sides of the second gate insulation layer 208 by using a same process as that for the first transistor 202.

Then, a third passivation layer 210 is formed, by using the CVD process, on a surface of a side that is of the second gate insulation layer 208 and that is away from the substrate 201. Subsequently, a source s and a drain d are respectively formed, by using the PVD process, at two ends of each of the active layer 212 of the first transistor 202 and the active layer 213 of the second transistor 203.

Figure 4D:
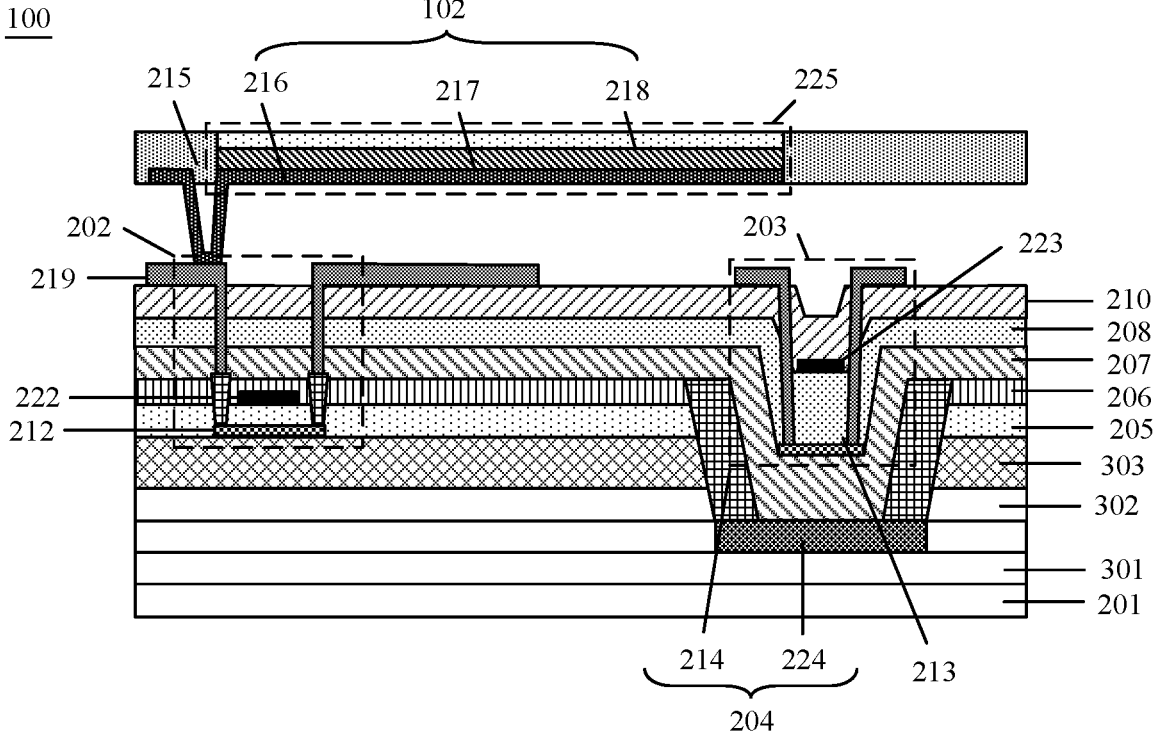
FIG. 4d is a schematic diagram of a structure of another display according to an embodiment of this application.

In addition, in FIG. 3, to ensure that the active layer 213 of the second transistor 203 is insulated from the isolation base 224, the second passivation layer 207 and the first stress relief layer 302 are disposed between the active layer 213 of the second transistor 203 and the isolation base 224. In some other embodiments of this application, as shown in FIG. 4*d*, only the second passivation layer 207 may be disposed between the active layer 213 of the second transistor 203 and the isolation base 224. Therefore, when the groove 228 is formed, at least a portion of each of the second barrier layer 303, the first gate insulation layer 205, the first passivation layer 206, and the first stress relief layer 302 that are located at the bottom of the groove 228 may be etched, so that the active layer 213 is insulated from the isolation base 224 by using the second passivation layer 207. In this case, the second barrier layer 303 is disposed on the outer surface that is of the isolation retaining wall 214 and that is away from the active layer 213 of the second transistor 203. It should be noted that in this example, other fabrication processes are as described above, and details are not described herein again.

Figure 4E:
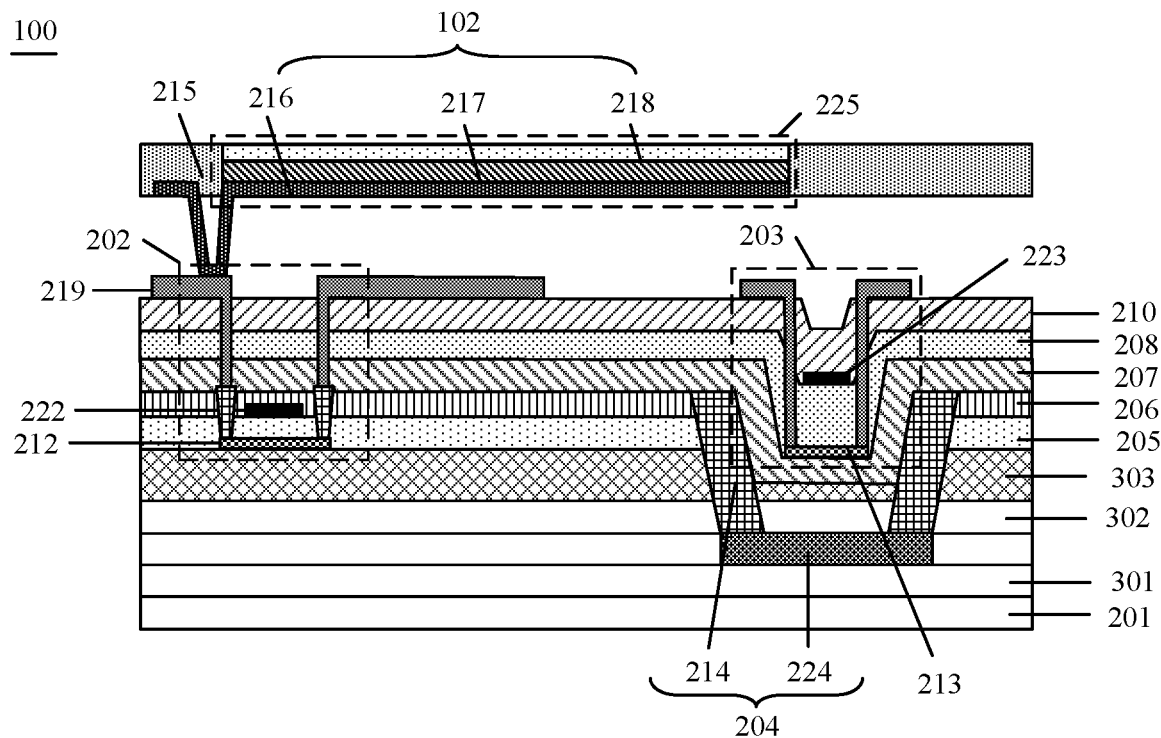
FIG. 4e is a schematic diagram of a structure of another display according to an embodiment of this application.

To ensure that the active layer 213 of the second transistor 203 is insulated from the isolation base 224, in some other embodiments of this application, as shown in FIG. 4*e*, the first stress relief layer 302, the second passivation layer 207, and a portion of the second barrier layer 303 may be disposed between the active layer 213 of the second transistor 203 and the isolation base 224 (compared with the solution described in FIG. 3, a portion of the second barrier layer 303 is additionally disposed between the active layer 213 of the second transistor 203 and the isolation base 224). Therefore, when the groove 228 is formed, at least a portion of each of the second barrier layer 303, the first gate insulation layer 205, and the first passivation layer 206 that are located at the bottom of the groove 228 may be etched, where the second barrier layer 303 at the bottom of the groove 228 is partially etched, so that the active layer 213 is insulated from the isolation base 224 by using the first stress relief layer 302, the second passivation layer 207, and a portion of the second barrier layer 303. In this case, regarding the second barrier layer 303, a first thickness of a portion, of the second barrier layer 303, that is located on the isolation retaining wall 214 and that is close to the active layer 213 of the second transistor 203 is less than a second thickness of a portion, of the second barrier layer 303, that is located on the isolation retaining wall 214 and that is away from the active layer 213 of the second transistor 203. It should be noted that in this example, other fabrication processes are as described above, and details are not described herein again.

Figure 5A:
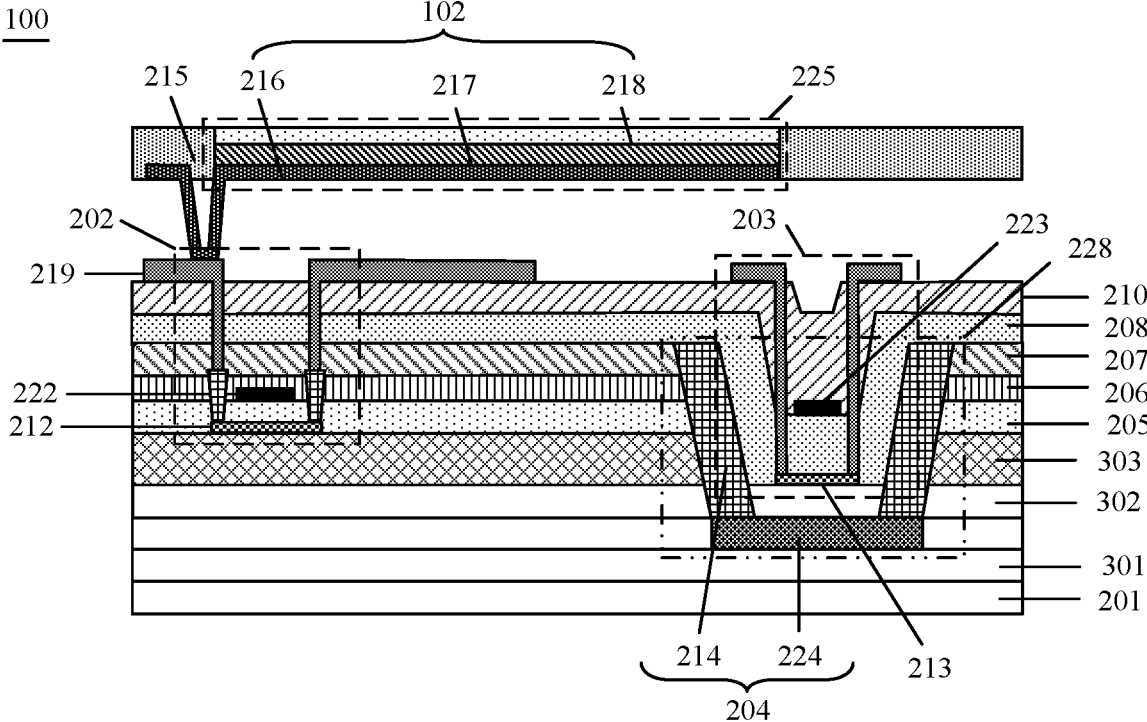
FIG. 5a is a schematic diagram of a structure of another display according to an embodiment of this application.

In some other embodiments of this application, as shown in FIG. 5*a*, the isolation retaining wall 214 may further penetrate the second passivation layer 207. In this case, a process of fabricating the display 100 having the structure of the isolation portion 204 is as follows.

The first barrier layer 301, the first stress relief layer 302, the second barrier layer 303, the active layer 212 of the first transistor 202, the first gate insulation layer 205, the first passivation layer 206, and the second passivation layer 207 are sequentially fabricated on the substrate 201. Fabrication processes of the foregoing layers are as described above, and are not described herein again. Subsequently, on the substrate on which the second passivation layer 207 is formed, the groove 228 is formed on one side (for example, the right side) of the first transistor 202 by using the dry etching process.

It will be appreciated from the foregoing description that, to determine which layer needs to be etched in the groove 228, at least the following condition needs to be satisfied: the active layer 213 of the second transistor 203 is insulated from the isolation base 224, and the second barrier layer 303 is disposed on the outer surface that is of the isolation retaining wall 214 and that is away from the active layer 213 of the second transistor 203; or the active layer 213 of the second transistor 203 is insulated from the isolation base 224, and a first thickness of a portion, of the second barrier layer 303, that is located on the isolation retaining wall 214 and that is close to the active layer 213 of the second transistor 203 is less than a second thickness of a portion, of the second barrier layer 303, that is located on the isolation retaining wall 214 and that is away from the active layer 213 of the second transistor 203. A size of the first thickness may be adjusted, so that the active layer 213 of the second transistor 203 is lower than the active layer 212 of the first transistor 202.

Figure 5B:
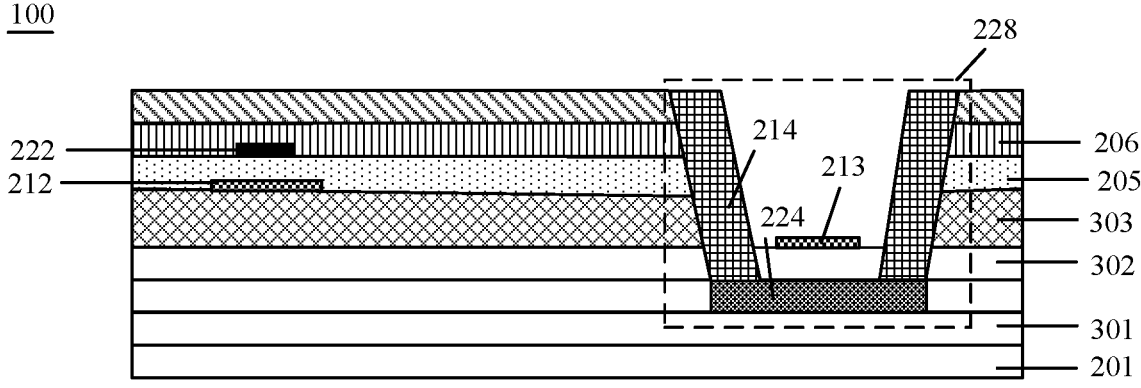
FIG. 5b is a schematic diagram of a structure of another display according to an embodiment of this application.

In FIG. 5b, for example, when the groove 228 is formed, at least a portion of each of the second barrier layer 303, the first gate insulation layer 205, the first passivation layer 206, and the second passivation layer 207 that are located at the bottom of the groove 228 may be etched. In this case, the active layer 213 is insulated from the isolation base 224 by using the first stress relief layer 302, and the second barrier layer 303 is disposed on the outer surface that is of the isolation retaining wall 214 and that is away from the active layer 213 of the second transistor 203, as described above. Other disposing manners are as described above, and details are not be described herein again.

Subsequently, the second gate insulation layer 208 is formed, by using the CVD process, on a surface of a side that is of the second passivation layer 207 and that is away from the substrate 201. In this case, a portion of the second gate insulation layer 208 is located in the isolation retaining wall 214. Other processes are as described above, and details are not described herein again.

For ease of description, the following provides descriptions by using an example in which the isolation retaining wall 214 penetrates the first gate insulation layer 205 and the first passivation layer 206.

Figure 6A:
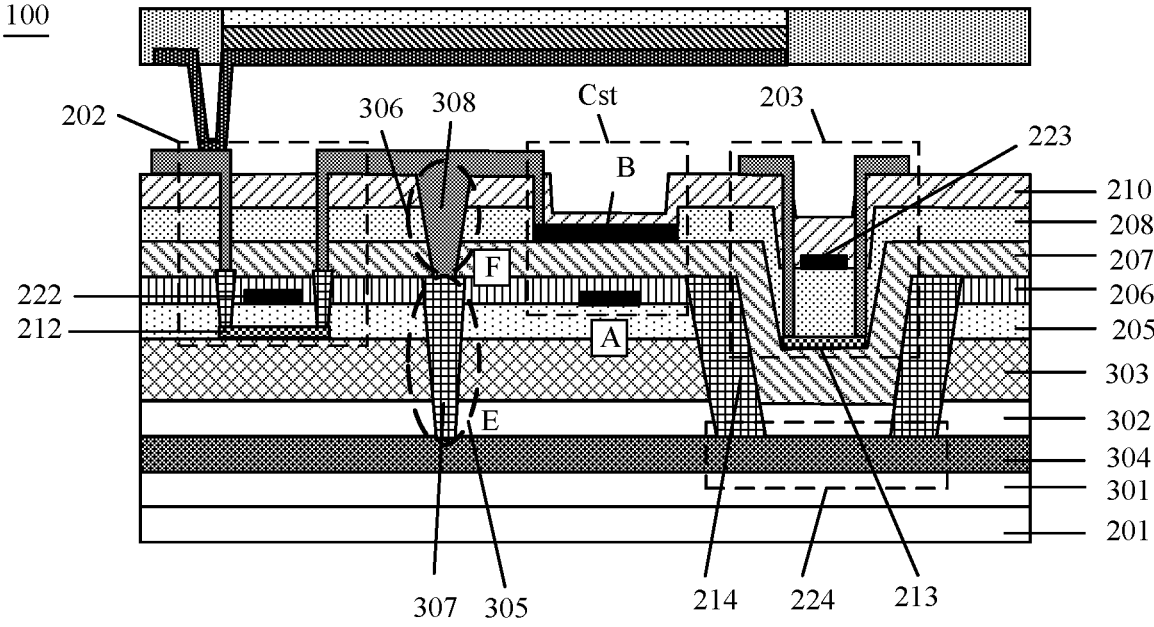
FIG. 6a is a schematic diagram of a structure of another display according to an embodiment of this application.

As shown in FIG. 2a, when the driving transistor Td is turned on, a current path is formed between a first voltage VDD and a second voltage VSS, so that a driving current generated by the driving transistor Td can flow into the light-emitting device 102, to drive the light-emitting device 102 to emit light. In this case, to supply the first voltage VDD to the pixel circuit 101 in each sub pixel 103, the display further includes a common electrode layer 304, as shown in FIG. 6a. The common electrode layer 304 can be coupled to a source s of the driving transistor Td in each pixel circuit 101, so as to supply the first voltage VDD to each pixel circuit 101.

Manners for disposing the common electrode layer 304 are described below in detail.

In this example, as shown in FIG. 6a, the common electrode layer 304 may be disposed between the first barrier layer 301 and the first stress relief layer 302. It will be appreciated from the foregoing description that, the isolation base 224 in the isolation portion 204 is located between the first barrier layer 301 and the first stress relief layer 302, and the isolation base 224 is made of a metal material. Therefore, to simplify a fabrication process, the isolation base 224 and the common electrode layer 304 may be disposed at a same layer and made of a same material, and may be integrally formed. In this way, fabrication of the common electrode layer 304 may be completed while the isolation substrate 224 is fabricated.

It should be noted that "a same layer" refers to a layer structure formed by first forming a film layer for forming a particular pattern through a same film forming process (for example, a coating process), and then by using a same mask through a single patterning process. Based on different particular patterns, a same patterning process may include a plurality of exposure, development, or etching processes. Moreover, the particular patterns in the formed layer structure may be continuous or discontinuous, and these particular patterns may also have different heights or different thicknesses.

Therefore, as shown in FIG. 6a, the display 100 may further include the common electrode layer 304. The common electrode layer 304 is located between the first barrier layer 301 and the first stress relief layer 302, and is connected to the first barrier layer 301 and the first stress relief layer 302.

The common electrode layer 304 includes a metal layer, or the common electrode layer 304 includes a metal layer and a surface oxide material layer stacked with the metal layer. For example, the common electrode layer 304 includes titanium/aluminum/titanium (Ti/Al/Ti), molybdenum/nickel/copper (Mo/Ni/Cu), copper (Cu), stainless steel (SUS), indium tin oxide (ITO), and a surface oxide layer including the Ti/Al/Ti, the Mo/Ni/Cu, the Cu, the SUS, and the ITO.

To implement the coupling between the common electrode layer 304 and the source s of the driving transistor Td (that is, the first transistor 202 or the second transistor 203, where the first transistor is used as an example in FIG. 6a), the display 100 may further include a first via 305 and a second via 306. In some embodiments of this application, the first via 305 successively penetrates the first stress relief layer 302, the second barrier layer 303, the first gate insulation layer 205, and the first passivation layer 206. Moreover, a first end E of the first via 305 is coupled to the common electrode layer 304, and a second end (that is, an end opposite to the end E) of the first via 305 is coupled to the first pole of the first transistor 202 or the second transistor 203. In addition, the first via 305 may include a first metal conductive layer 307, and the first metal conductive layer 307 and the isolation retaining wall 214 are at a same layer and made of a same material.

In addition, a first end F of the second via 306 is coupled to the second end (that is, the end opposite to the end E) of the first via hole 305, and a second end (that is, an end opposite to the end F) of the second via 306 is coupled the first pole of the first transistor 202 or the second transistor 203. In addition, the second via 306 may include a second metal conductive layer 308, and the second metal conductive layer 308 and the first pole of the first transistor 202 are at the same layer and made of a same material.

It should be noted that a material constituting the first metal conductive layer 307 may be titanium/aluminum/titanium (Ti/Al/Ti), molybdenum/aluminum/molybdenum (Mo/Al/Mo), molybdenum (Mo), copper (Cu), or the like. The first metal conductive layer 307 and the isolation retaining wall 214 penetrate same film layers (for example, the first stress relief layer 302, the second barrier layer 303, the first gate insulation layer 205, and the first passivation layer 206). Therefore, the first metal conductive layer 307 and the isolation retaining wall 214 may be at a same layer and made of a same material. In this way, the first metal conductive layer 307 may be formed by using a same mask while the isolation retaining wall 214 is fabricated, and therefore a process is simplified.

In addition, a material constituting the second metal conductive layer 308 may be titanium/aluminum/titanium (Ti/Al/Ti), copper (Cu), molybdenum/nickel/copper (Mo/Ni/Cu), molybdenum/aluminum/molybdenum (Mo/Al/Mo), or another material. The second metal conductive layer 308 and the first pole (or the second pole) of the first transistor 202 penetrate same film layers (for example, the second passivation layer 207, the second gate insulation layer 208, and the third passivation layer 210). Therefore, the second metal conductive layer 308 and first pole (or the second pole) of the first transistor 202 may be at a same layer and made of a same material. In this way, the second metal conductive layer 308 may be formed by using a same mask while the first pole (or the second pole) of the first transistor 202 is fabricated, and therefore a process is simplified.

Subsequently, process difficulty can be reduced by classifying vias into the first via 305 and the second via 306.

It will be appreciated from the foregoing description that, in the embodiments of this application, the common electrode layer 304 is disposed on a side that is of the transistor TFT and that is close to the substrate 201, and is not at a same layer with the source/drain (S/D). In this way, voltage drop (IR drop) can be reduced, thereby avoiding crosstalk of a data line. In addition, layout space of the data line is reduced, and resolution is improved. Moreover, the common electrode layer 304 is not located at a position of an upper laminated layer. In this case, a thickness of the laminated layer can be reduced, thereby facilitating continuous bending of the display. Further, because the common electrode layer 304 is made of a metal material and is electrically connected to the first pole of the first transistor 202, an external electric field and electrostatic discharge (ESD) can be shielded from entering the display 100, thereby improving stability of the light-emitting device 102. Subsequently, because the rigidity of the metal material is greater than that of an inorganic material or an organic material, when the common electrode layer 304 is added on the substrate 201, the common electrode layer 304 can provide a function of supporting the display. For a flexible display, stress on a panel of the display can be made uniform, thereby implementing a continuous bending effect. In addition, a problem of film deformation and scattered bright spots during a production process is improved. Finally, the common electrode layer 304 may further shelter the active layer 212 of the first transistor 202 and the active layer 213 of the second transistor 203 from being damaged by ambient light, laser lift off (LLO), and other processes during processing.

To shelter the active layer 212 of the first transistor 202 and the active layer 213 of the second transistor 203, the common electrode layer 304 may have a shape of a thin film layer that covers the entire substrate 201, or may be a thin film layer having a hollow-out pattern. The hollow-out pattern may include a grid-like pattern, a mesh-like pattern, and the like. However, when the common electrode layer 304 has a hollow-out pattern, at least the following needs to be satisfied: a vertical projection, of the active layer 212 of the first transistor 202, on the substrate 201 is within a range of a vertical projection, of the common electrode layer 304, on the substrate 201; and a vertical projection, of the active layer 213 of the second transistor 203, on the substrate 201 is within the range of the vertical projection, of the common electrode layer 304, on the substrate 201.

It will be appreciated from FIG. 2a that, the display 100 may further include a storage capacitor Cst, to maintain the gate voltage of the driving transistor Td (that is, the first transistor 202), so that the gate voltage of the driving transistor Td (that is, the first transistor 202) can be stabilized in one image frame. Therefore, in some embodiments of this application, as shown in FIG. 6a, the storage capacitor Cst may further include a first electrode A and a second electrode B that are insulated. The first electrode A is located on the surface of the side that is of the first gate insulation layer 205 and that is away from the substrate 201. The first electrode A and the gate 222 of the first transistor 202 are at a same layer and made of a same material. In addition, the second electrode B is located on the surface of the side that is of the second passivation layer 207 and that is away from the substrate 201; the second electrode B is coupled to the first transistor 202; and the second electrode B and the gate 222 of the second transistor 203 are at a same layer and made of a same material. In this case, the second electrode B is an upper plate of the storage capacitor Cst, and the first electrode A is a lower plate of the storage capacitor.

Therefore, the first electrode A and the second electrode B of the storage capacitor Cst may be fabricated separately by using a same mask while the first gate 222 of the first transistor 202 and the second gate 223 of the second transistor 203 are fabricated, and therefore a process is simplified.

It should be noted that, positions of the first electrode A and the second electrode B of the storage capacitor Cst are not limited in this application. The first electrode A and the second electrode B may be disposed at different laminated layers based on a requirement (for example, the first electrode A may be disposed on the first gate insulation layer 205, and is at a same layer and made of a same material as the active layer 212 of the first transistor 202), provided that the first electrode A and the second electrode B are not at a same laminated layer.

Figure 6B:
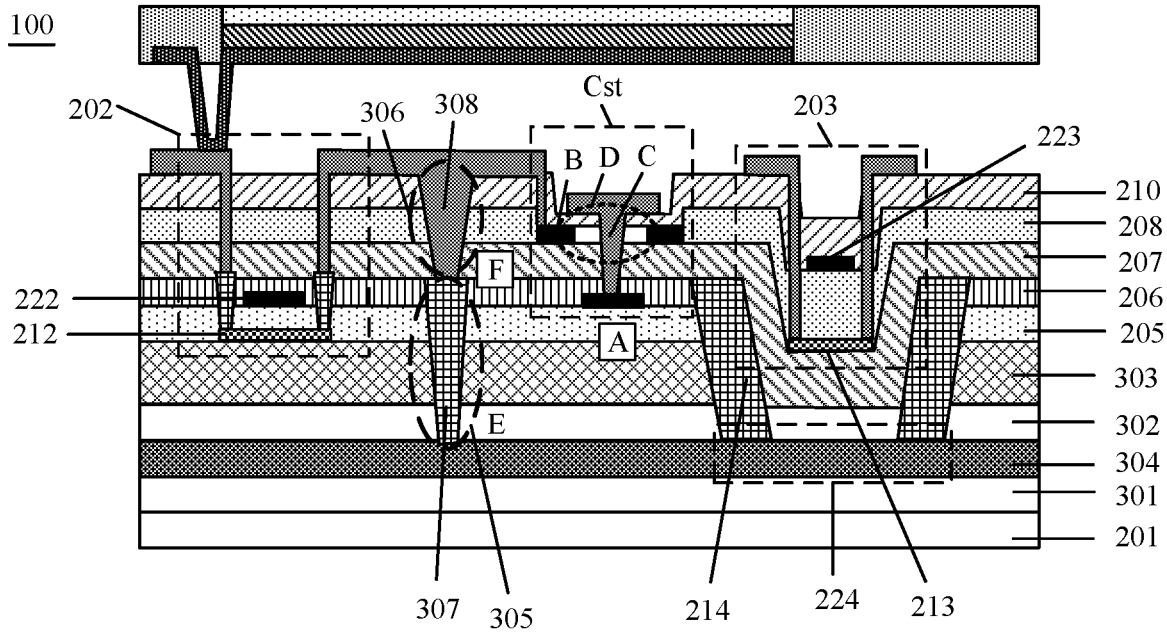
FIG. 6b is a schematic diagram of a structure of another display according to an embodiment of this application.

Alternatively, in some other embodiments of this application, as shown in FIG. 6b, the storage capacitor Cst may include a first electrode A, a second electrode B, and a third electrode C located between the first electrode A and the second electrode B. The third electrode C is located on a surface of a side that is of the third passivation layer 210 and that is away from the substrate 201, and covers the second electrode B. The third electrode C and the first pole of the first transistor 202 are at a same layer and made of a same material. The display 100 further includes a third via D that penetrates the second electrode B, and the third electrode C is coupled to the first electrode A through the third via D. In this case, the third electrode C is electrically connected to the first electrode A, and is equivalent to a pole of the storage capacitance Cst. Moreover, the second electrode B is equivalent to the other pole of the storage capacitance Cst. Compared with the solution described above (the solution in which the storage capacitor Cst includes only the first electrode A and the second electrode B), a relative area of the two poles of the storage capacitor Cst is increased. In this way, an energy storage effect of the storage capacitor Cst is enhanced. Similarly, positions of the first electrode A and the second electrode B in the storage capacitor Cst are not limited in this application. The first electrode A and the second electrode B may be disposed at different laminated layers based on a requirement, provided that the first electrode A and the second electrode B are not at a same laminated layer.

The foregoing descriptions are provided by using an example in which the first transistor 202 and the second transistor 203 each belongs to a top-gate type. In some other embodiments of this application, the first transistor 202 may alternatively have a double-gate structure. In this case, as shown in FIG. 7a, in addition to the first gate 222, the first transistor 202 further includes a third gate 309.

In this case, the third gate 309 is at a same layer and made of a same material as the common electrode layer 304, and is insulated from the common electrode layer 304. The third gate 309 is located on a side that is of the first gate 222 of the first transistor 202 and that is close to the substrate 201, and the first gate 222 in the first transistor 202 is insulated from the third gate 309. On this basis, the third gate 309 may be formed by using a same mask while the common electrode layer 304 is fabricated, and therefore a process is simplified. In addition, as compared with a single gate, a driving capability of the first transistor 202 can be improved through two gates.

In some other embodiments of this application, the second transistor 203 may also have a double-gate structure. In this case, as shown in FIG. 7b, in addition to the first gate 222, the second transistor 203 further includes a fourth gate 310. In this case, the fourth gate 310 is at a same layer and made of a same material as the common electrode layer 304, and is insulated from the common electrode layer 304. The fourth gate 310 is located on a side that is of the second gate 223 of the second transistor 203 and that is close to the substrate 201, and the second gate 223 in the second transistor 203 is insulated from the fourth gate 310. On this basis, the second gate may be formed by using a same mask while the common electrode layer is fabricated, and therefore a process is simplified. In addition, as compared with a single gate, a driving capability of the second transistor 203 can be improved through two gates.

Figure 7A:
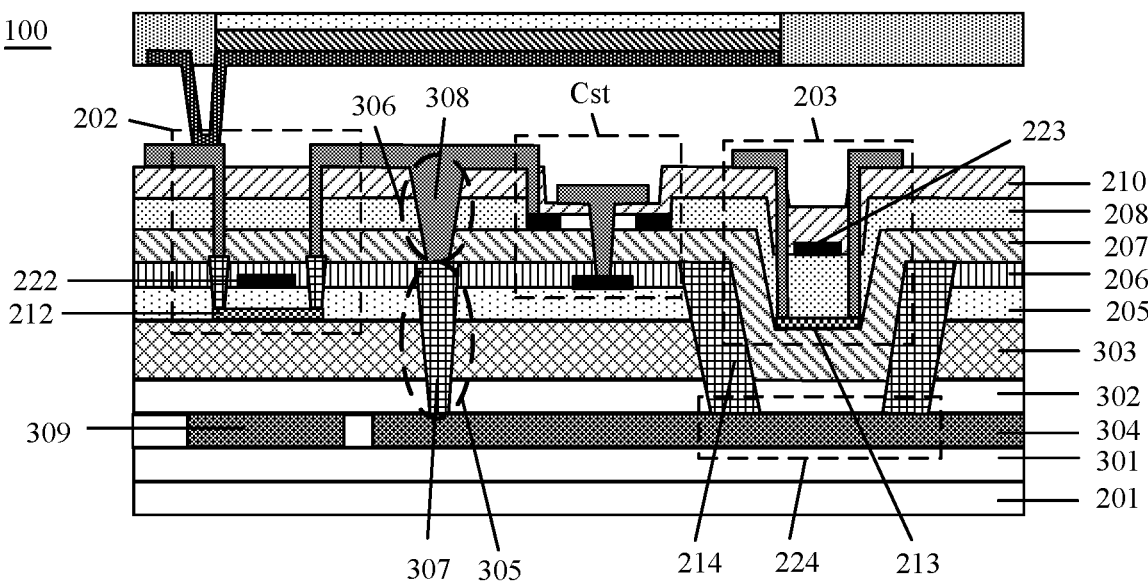
FIG. 7a is a schematic diagram of a structure of another display according to an embodiment of this application.
Figure 7B:
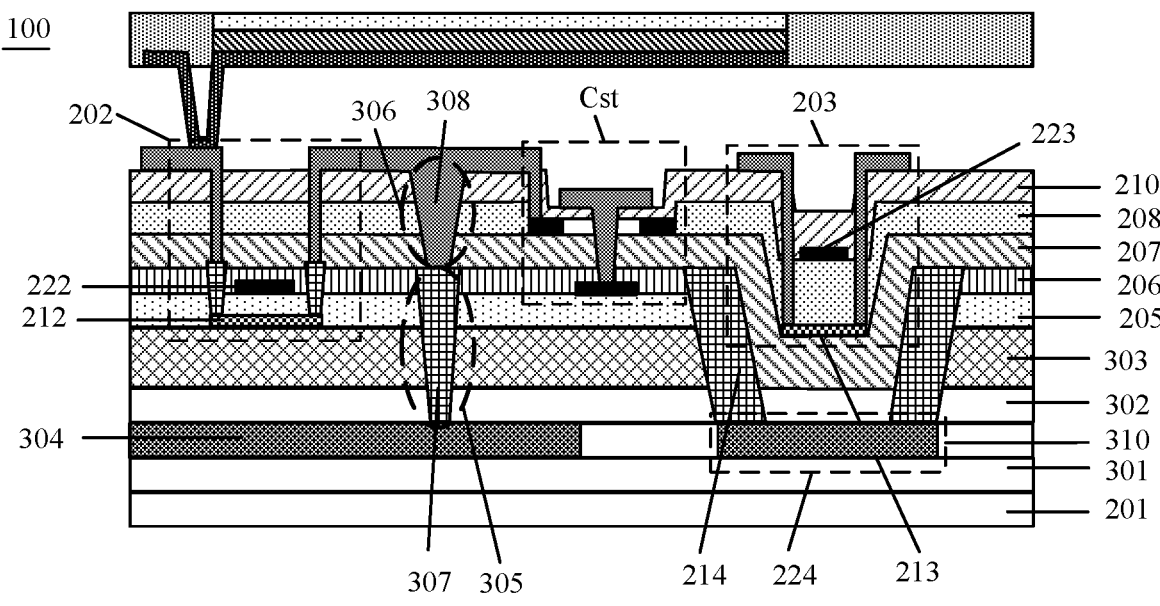
FIG. 7b is a schematic diagram of a structure of another display according to an embodiment of this application.

It should be noted that FIG. 7a is described by using an example in which the first transistor 202 has a double-gate structure and the second transistor 203 has a top-gate structure, and FIG. 7b is described by using an example in which the first transistor 202 has a top-gate structure and the second transistor 203 has a double-gate structure. In some other embodiments of this application, both the first transistor 202 and the second transistor 203 may have a double-gate structure. This is not limited in this application.

Example 2

Figure 8:
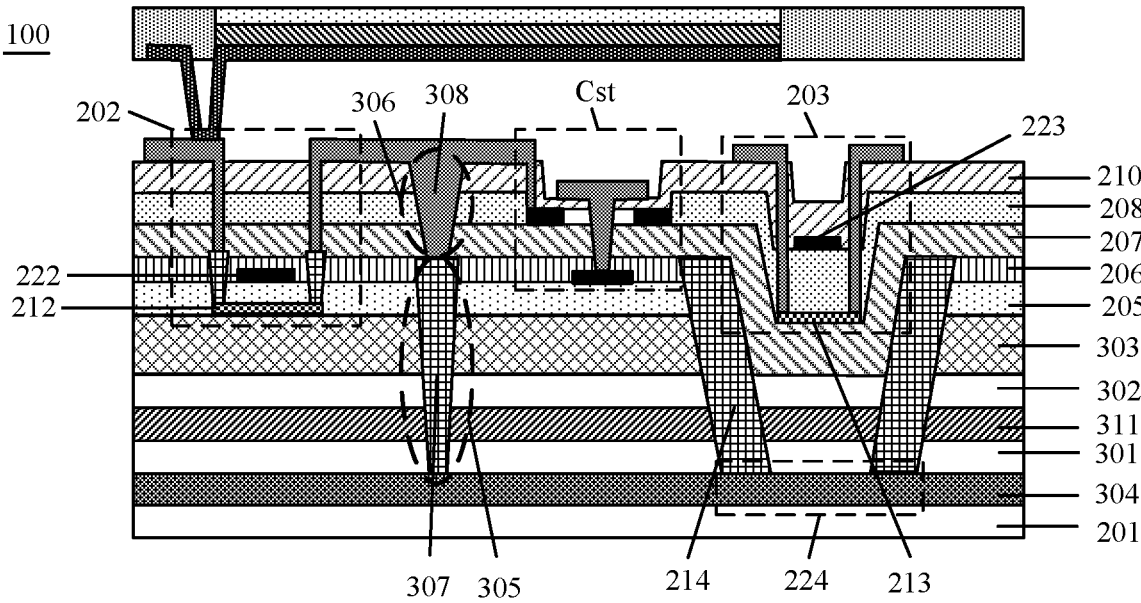
FIG. 8 is a schematic diagram of a structure of another display according to an embodiment of this application.

This example is the same as Example 1 in that the display 100 is a flexible display. As shown in FIG. 8, the materials constituting the substrate 201 include an organic material. The display 100 further includes a first barrier layer 301, a first stress relief layer 302, and a second barrier layer 303 that are sequentially located on the substrate 201. The active layer 212 of the first transistor 202 is located on a surface of a side that is of the second barrier layer 303 and that is away from the substrate 201. Different from Example 1, there is a connection layer 311 between the first barrier layer 301 and the first stress relief layer 302. The connection layer 311 is configured to increase an adhesion force between the first barrier layer 301 and the first stress relief layer 302.

In this example, a common electrode layer 304 is located between the substrate 201 and the first barrier layer 301, and is connected to the substrate 201 and the first barrier layer 301. It will be appreciated from the foregoing description that, the common electrode layer 304 and the isolation base 224 may be at a same layer and made of a same material. Therefore, as shown in FIG. 8, the isolation base 224 is also located between the substrate 201 and the first barrier layer 301.

In this case, the isolation retaining wall 214 may penetrate the first passivation layer 206 to the first barrier layer 301, and may be electrically connected to the common electrode layer 304. The active layer 213 of the second transistor 203 is insulated from the isolation base 224 by using the first barrier layer 301, the connection layer 311, the first stress relief layer 302, and the second passivation layer 207. In this case, the second barrier layer 303 is disposed on an outer surface that is of the isolation retaining wall 214 and that is away from the active layer 213 of the second transistor 203.

It should be noted that, disposing of an insulation layer between the active layer 213 of the second transistor 203 and the isolation base 224 is not limited in this application, provided that the following is satisfied: the active layer 213 of the second transistor 203 is insulated from the isolation base 224, and the second barrier layer 303 is disposed on the outer surface that is of the isolation retaining wall 214 and that is away from the active layer 213 of the second transistor 203; or the active layer 213 of the second transistor 203 is insulated from the isolation base 224, and a first thickness of a portion, of the second barrier layer 303, that is located on the isolation retaining wall 214 and that is close to the active layer 213 of the second transistor 203 is less than a second thickness of a portion, of the second barrier layer 303, that is located on the isolation retaining wall 214 and that is away from the active layer 213 of the second transistor 203. A size of the first thickness may be adjusted, so that the active layer 213 of the second transistor 203 is lower than the active layer 212 of the first transistor 202. A specific disposing method is as described above, and details are not described herein again.

In this example, the isolation retaining wall 214 may further penetrate the second passivation layer 207. A method for disposing the isolation retaining wall 214 is as described above, and details are not described herein again. In addition, manners for disposing the first transistor 202, the second transistor 203, and the storage capacitor Cst are as described above, and details are not described herein again.

Example 3

Figure 9:
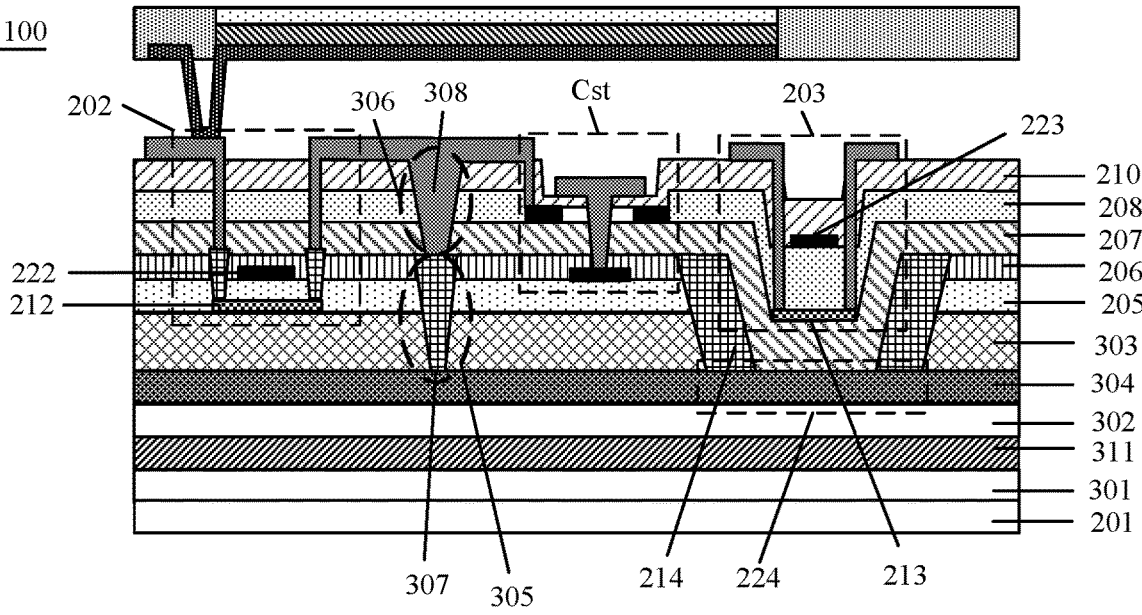
FIG. 9 is a schematic diagram of a structure of another display according to an embodiment of this application.

This example is the same as Example 1 in that the display 100 is a flexible display. As shown in FIG. 9, the materials constituting the substrate 201 include an organic material. The display 100 includes a first barrier layer 301, a first stress relief layer 302, and a second barrier layer 303 that are sequentially located on the substrate 201. The active layer 212 of the first transistor 202 is located on a surface of a side that is of the second barrier layer 303 and that is away from the substrate 201. Different from Example 1, there is a connection layer 311 between the first barrier layer 301 and the first stress relief layer 302. The connection layer 311 is configured to increase an adhesion force between the first barrier layer 301 and the first stress relief layer 302.

In this example, a common electrode layer 304 is located between the stress relief layer 302 and the second barrier layer 303, and is connected to the first stress relief layer 302 and the second barrier layer 303. It will be appreciated from the foregoing description that, the common electrode layer 304 and the isolation base 224 may be at a same layer and made of a same material. Therefore, as shown in FIG. 9, the isolation base 224 is also located between the first stress relief layer 302 and the second barrier layer 303.

In this case, the isolation retaining wall 214 may penetrate the first passivation layer 206 to the first barrier layer 301, and may be electrically connected to the common electrode layer 304. The active layer 213 of the second transistor 203 is insulated from the isolation base 224 by using the second passivation layer 207. In this case, the second barrier layer 303 is disposed on an outer surface that is of the isolation retaining wall 214 and that is away from the active layer 213 of the second transistor 203.

It should be noted that, disposing of an insulation layer between the active layer 213 of the second transistor 203 and the isolation base 224 is not limited in this application, provided that the following is satisfied: the active layer 213 of the second transistor 203 is insulated from the isolation base 224, and the second barrier layer 303 is disposed on the outer surface that is of the isolation retaining wall 214 and that is away from the active layer 213 of the second transistor 203; or the active layer 213 of the second transistor 203 is insulated from the isolation base 224, and a first thickness of a portion, of the second barrier layer 303, that is located on the isolation retaining wall 214 and that is close to the active layer 213 of the second transistor 203 is less than a second thickness of a portion, of the second barrier layer 303, that is located on the isolation retaining wall 214 and that is away from the active layer 213 of the second transistor 203. A size of the first thickness may be adjusted, so that the active layer 213 of the second transistor 203 is lower than the active layer 212 of the first transistor 202. A specific disposing method is as described above, and details are not described herein again.

In this example, the isolation retaining wall 214 may further penetrate the second passivation layer 207. A method for disposing the isolation retaining wall 214 is as described above, and details are not described herein again. In addition, manners for disposing the first transistor 202, the second transistor 203, and the storage capacitor Cst are as described above, and details are not described herein again.

Example 4

Figure 10:
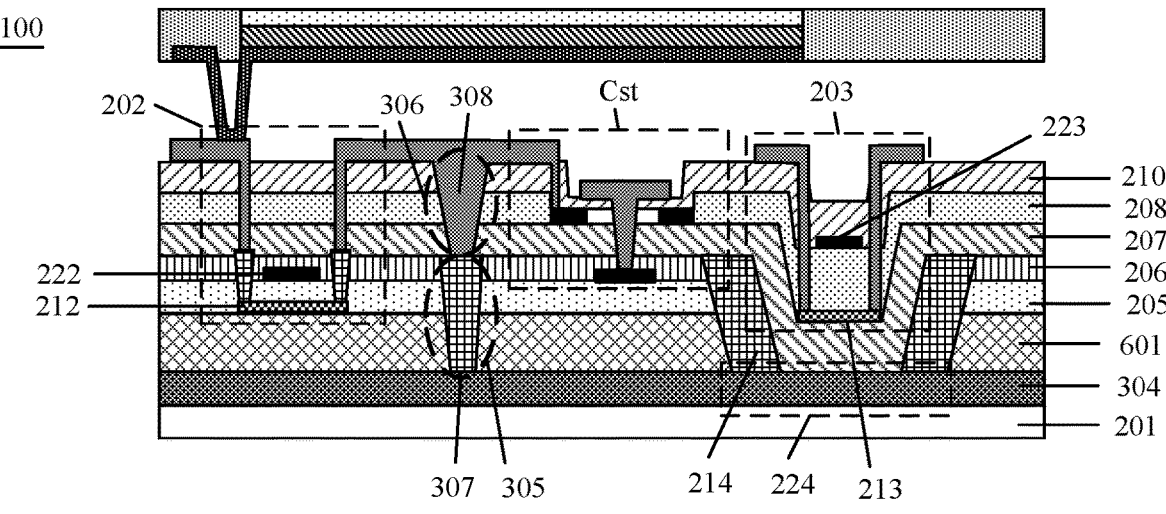
FIG. 10 is a schematic diagram of a structure of another display according to an embodiment of this application.

This example is different from Example 1. In this example, the display 100 is a rigid display. As shown in FIG. 10, the materials constituting the substrate 201 include an inorganic material, and the display 100 further includes a buffer layer 601 located on the substrate 201.

In this example, a common electrode layer 304 is located between the substrate 201 and the buffer layer 601, and is connected to the substrate 201 and the buffer layer 601. It will be appreciated from the foregoing description that, the common electrode layer 304 and the isolation base 224 may be at a same layer and made of a same material. Therefore, as shown in FIG. 10, the isolation base 224 is also located between the substrate 201 and the buffer layer 601.

In this case, the isolation retaining wall 214 may penetrate the first passivation layer 206 to the first barrier layer 301, and may be electrically connected to the common electrode layer 304. The active layer 213 of the second transistor 203 is insulated from the isolation base 224 by using the second passivation layer 207.

It should be noted that, disposing of an insulation layer between the active layer 213 of the second transistor 203 and the isolation base 224 is not limited in this application, provided that the following is satisfied: the active layer 213 of the second transistor 203 is insulated from the isolation base 224, and the buffer layer 601 is disposed on an outer surface that is of the isolation retaining wall 214 and that is away from the active layer 213 of the second transistor 203; or the active layer 213 of the second transistor 203 is insulated from the isolation base 224, and a first thickness of a portion, of the buffer layer 601, that is located on the isolation retaining wall 214 and that is close to the active layer 213 of the second transistor 203 is less than a second thickness of a portion, of the buffer layer 601, that is located on the isolation retaining wall 214 and that is away from the active layer 213 of the second transistor 203. The thickness is a length in a direction in which the buffer layer 601 grows when the buffer layer 601 is deposited on the substrate 201. A size of the first thickness may be adjusted, so that the active layer 213 of the second transistor 203 is lower than the active layer 212 of the first transistor 202. A specific disposing method is as described above, and details are not described herein again.

In this example, the isolation retaining wall 214 may further penetrate the second passivation layer 207. A method for disposing the isolation retaining wall 214 is as described above, and details are not described herein again. In addition, manners for disposing the first transistor 202, the second transistor 203, and the storage capacitor Cst are as described above, and details are not described herein again.

An embodiment of this application further provides an electronic device. The electronic device includes any display described above. The electronic device has same technical effects as the display provided in the foregoing embodiment. Details are not described herein again.

The foregoing description provides exemplary implementations of this application, but is not intended to limit the protection scope of this application. Any variation or replacement within the technical scope disclosed in this application may fall within the protection scope of this application.

What is claimed is:

1. A display, comprising:
a plurality of sub pixels;
a substrate;
a light-emitting device disposed on the substrate and located in a sub pixel;
a pixel circuit disposed on the substrate and located in the sub pixel, wherein the pixel circuit and the light-emitting device are coupled, wherein the pixel circuit comprises a first transistor and a second transistor, wherein an active layer of the first transistor comprises polycrystalline silicon, and wherein an active layer of the second transistor comprises semiconductor oxide;
an isolation portion disposed on the substrate and located in the sub pixel, wherein the isolation portion comprises an isolation base and an isolation retaining wall surrounding the isolation base, wherein the active layer of the second transistor is disposed in a groove formed by the isolation retaining wall and the isolation base, and wherein the isolation portion is configured to block hydrogen ions in the active layer of the first transistor from being diffused into the active layer of the second transistor; and
a common electrode layer located on a side that is of the first transistor and the second transistor, wherein a first pole of the first transistor or the second transistor is coupled to the common electrode layer, and wherein the isolation base and the common electrode layer are at a same layer, made of a same material, and integrally formed.

2. The display according to claim 1, wherein the display further comprises a first gate insulation layer, a first passivation layer, a second passivation layer, and a second gate insulation layer that are successively located on the substrate, wherein materials constituting the first passivation layer comprise silicon nitride, and wherein materials constituting the second passivation layer comprise silicon oxide;
wherein the first gate insulation layer is located between the active layer of the first transistor and a first gate, and wherein the first gate is covered by the first passivation layer and the second passivation layer; and
wherein the isolation retaining wall penetrates at least the first gate insulation layer and the first passivation layer, wherein at least a portion of the second gate insulation layer is located in the isolation retaining wall, and wherein the second gate insulation layer is located between the active layer of the second transistor and a second gate.

3. The display according to claim 2, wherein the isolation retaining wall further penetrates the second passivation layer.

4. The display according to claim 1, wherein the common electrode layer comprises a metal layer;

wherein a vertical projection of the active layer of the first transistor on the substrate is located within a range of a vertical projection of the common electrode layer on the substrate; and wherein a vertical projection of the active layer of the second transistor on the substrate is located within the range of the vertical projection of the common electrode layer on the substrate.

5. The display according to claim 1, wherein the first transistor further comprises a third gate located on a side that is of a first gate of the first transistor, wherein the first gate of the first transistor is insulated from the third gate; and wherein the third gate of the first transistor is at a same layer and made of a same material as the common electrode layer, and is insulated from the common electrode layer.

6. The display according to claim 1, wherein the second transistor further comprises a fourth gate located on a side that is of a second gate of the second transistor, and the second gate of the second transistor is insulated from the fourth gate; and wherein the fourth gate of the second transistor is at a same layer and made of a same material as the common electrode layer, and is insulated from the common electrode layer.

7. The display according to claim 1, wherein materials constituting the substrate comprise an organic material;

wherein the display further comprises a first barrier layer, a first stress relief layer, and a second barrier layer that are sequentially located on the substrate, wherein the active layer of the first transistor is located on a surface of a side that is of the second barrier layer and that is away from the substrate; and wherein the common electrode layer is located between the first barrier layer and the first stress relief layer, and is connected to the first barrier layer and the first stress relief layer.

8. The display according to claim 7, wherein the display further comprises a first via, wherein the first via sequentially penetrates through the first stress relief layer, the second barrier layer, a first gate insulation layer, and a first passivation layer, wherein a first end of the first via is coupled to the common electrode layer, and wherein a second end of the first via is coupled to the first pole of the first transistor or the second transistor; and wherein the first via comprises a first metal conductive layer, wherein the isolation retaining wall and the first metal conductive layer are at a same layer and made of a same material.

9. The display according to claim 8, wherein the display further comprises a second via, wherein a first end of the second via is coupled to the second end of the first via, and wherein a second end of the second via is coupled to the first pole of the first transistor or the second transistor; and wherein the second via comprises a second metal conductive layer, wherein the second metal conductive layer and the first pole of the first transistor or the second transistor are at a same layer and made of a same material.

10. The display according to claim 1, wherein materials constituting the substrate comprise an organic material;

wherein the display further comprises a first barrier layer, a connection layer, and a first stress relief layer that are sequentially located on the substrate, wherein the connection layer is configured to connect the first barrier layer to the first stress relief layer; and wherein:

the common electrode layer is located between the substrate and the first barrier layer, and is connected to the substrate and the first barrier layer; or the display further comprises a second barrier layer located on a side that is of the first stress relief layer and that is away from the substrate, the active layer of the first transistor is located on a surface of a side that is of the second barrier layer and that is away from the substrate, and the common electrode layer is located between the first stress relief layer and the second barrier layer, and is connected to the first stress relief layer and the second barrier layer.

11. The display according to claim 7, wherein the active layer of the second transistor is insulated from the isolation base, and wherein the second barrier layer is disposed on an outer surface that is of the isolation retaining wall and that is away from the active layer of the second transistor.

12. The display according to claim 1, wherein materials constituting the substrate comprise an inorganic material;

wherein the display further comprises a buffer layer located on the substrate, wherein the common electrode layer is located between the substrate and the buffer layer, and is connected to the substrate and the buffer layer; and wherein the active layer of the second transistor is insulated from the isolation base, and the buffer layer is disposed on an outer surface that is of the isolation retaining wall and that is away from the active layer of the second transistor.

13. The display according to claim 2, wherein the pixel circuit further comprises a storage capacitor comprising a first electrode and a second electrode that are insulated;

wherein the first electrode is located on a surface of a side that is of the first gate insulation layer and that is away from the substrate, and the first electrode and a gate of the first transistor are at a same layer and made of a same material; and wherein the second electrode is located on a surface of a side that is of the second passivation layer and that is away from the substrate, the second electrode is coupled to the first transistor, and the second electrode and a gate of the second transistor are at a same layer and made of a same material.

14. The display according to claim 13, wherein the display further comprises a third passivation layer that covers the second gate insulation layer;

wherein the storage capacitor further comprises a third electrode located on a surface of a side that is of the third passivation layer, that is away from the substrate, and that covers the second electrode, wherein the third electrode and the first pole of the first transistor or the second transistor are at a same layer and made of a same material; and wherein the display further comprises a third via that penetrates the second electrode, wherein the third electrode is coupled to the first electrode through the third via.

15. The display according to claim 1, wherein the first transistor is coupled to the light-emitting device, and the first transistor is configured to provide a driving current to the light-emitting device.

16. An electronic device, comprising:

a display, wherein the display comprises:

a plurality of sub pixels;

a substrate;

a light-emitting device disposed on the substrate and located in a sub pixel;

a pixel circuit disposed on the substrate and located in the sub pixel, wherein the pixel circuit and the light-emitting device are coupled, wherein the pixel circuit comprises a first transistor and a second transistor, wherein an active layer of the first transistor comprises polycrystalline silicon, and wherein an active layer of the second transistor comprises semiconductor oxide;

an isolation portion disposed on the substrate and located in the sub pixel, wherein the isolation portion comprises an isolation base and an isolation retaining wall surrounding the isolation base, wherein the active layer of the second transistor is disposed in a groove formed by the isolation retaining wall and the isolation base, and wherein the isolation portion is configured to block hydrogen ions in the active layer of the first transistor from being diffused into the active layer of the second transistor; and a common electrode layer located on a side that is of the first transistor and the second transistor, wherein a first pole of the first transistor or the second transistor is coupled to the common electrode layer, and wherein the isolation base and the common electrode layer are at a same layer, made of a same material, and integrally formed.

17. A display, comprising:
a plurality of sub pixels;
a substrate;
a light-emitting device disposed on the substrate and located in a sub pixel;
a pixel circuit disposed on the substrate and located in the sub pixel, wherein the pixel circuit and the light-emitting device are coupled, wherein the pixel circuit comprises a first transistor and a second transistor, wherein an active layer of the first transistor comprises polycrystalline silicon, and wherein an active layer of the second transistor comprises semiconductor oxide; and an isolation portion disposed on the substrate and located in the sub pixel, wherein the isolation portion comprises an isolation base and an isolation retaining wall surrounding the isolation base, wherein the active layer of the second transistor is disposed in a groove formed by the isolation retaining wall and the isolation base, and wherein the isolation portion is configured to block hydrogen ions in the active layer of the first transistor from being diffused into the active layer of the second transistor;

wherein the display further comprises a first gate insulation layer, a first passivation layer, a second passivation layer, and a second gate insulation layer that are successively located on the substrate, wherein materials constituting the first passivation layer comprise silicon nitride, and wherein materials constituting the second passivation layer comprise silicon oxide;

wherein the first gate insulation layer is located between the active layer of the first transistor and a first gate, and wherein the first gate is covered by the first passivation layer and the second passivation layer;

wherein the isolation retaining wall penetrates at least the first gate insulation layer and the first passivation layer, wherein at least a portion of the second gate insulation layer is located in the isolation retaining wall, and wherein the second gate insulation layer is located between the active layer of the second transistor and a second gate;

wherein the pixel circuit further comprises a storage capacitor comprising a first electrode and a second electrode that are insulated;

wherein the first electrode is located on a surface of a side that is of the first gate insulation layer and that is away from the substrate, and the first electrode and a gate of the first transistor are at a same layer and made of a same material; and wherein the second electrode is located on a surface of a side that is of the second passivation layer and that is away from the substrate, the second electrode is coupled to the first transistor, and the second electrode and a gate of the second transistor are at a same layer and made of a same material.

18. The display according to claim 17, wherein the isolation retaining wall further penetrates the second passivation layer.

19. The display according to claim 17, wherein the display further comprises a third passivation layer that covers the second gate insulation layer;

wherein the storage capacitor further comprises a third electrode located on a surface of a side that is of the third passivation layer, that is away from the substrate, and that covers the second electrode, wherein the third electrode and the first pole of the first transistor or the second transistor are at a same layer and made of a same material; and wherein the display further comprises a third via that penetrates the second electrode, wherein the third electrode is coupled to the first electrode through the third via.

20. The display according to claim 17, wherein the first transistor is coupled to the light-emitting device, and the first transistor is configured to provide a driving current to the light-emitting device.

* * * * *